(12) United States Patent
Cabral, Jr. et al.

(10) Patent No.: US 7,781,871 B2
(45) Date of Patent: Aug. 24, 2010

(54) STRUCTURE FOR REDUCTION OF SOFT ERROR RATES IN INTEGRATED CIRCUITS

(75) Inventors: Cyril Cabral, Jr., Yorktown Heights, NY (US); Michael S. Gordon, Yorktown Heights, NY (US); Kenneth P. Rodbell, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/483,364

(22) Filed: Jun. 12, 2009

(65) Prior Publication Data

US 2009/0243053 A1    Oct. 1, 2009

Related U.S. Application Data

(62) Division of application No. 12/051,040, filed on Mar. 19, 2008, now Pat. No. 7,601,627, which is a division of application No. 11/183,647, filed on Jul. 18, 2005, now Pat. No. 7,381,635.

(51) Int. Cl.
   *H01L 23/552* (2006.01)
(52) U.S. Cl. .................. 257/660; 438/555; 438/614
(58) Field of Classification Search .............. 257/660, 257/737, E23.021, E23.169
   See application file for complete search history.

(56) References Cited

U.S. PATENT DOCUMENTS 5,386,382 A * 1/1995 Ahn ............................ 365/174
6,410,414 B1 * 6/2002 Lee ............................. 438/612
7,041,571 B2   5/2006 Strane
7,067,918 B2   6/2006 Murata et al.
7,164,197 B2 * 1/2007 Mao et al. .................... 257/700
2005/0186326 A1 8/2005 Baumann
2006/0150128 A1 7/2006 Zhu et al.

OTHER PUBLICATIONS

Notice of Allowance (Mail Date Jun. 2, 2009) for U.S. Appl. No. 12/051,040, filed Mar. 19, 2008.

* cited by examiner

*Primary Examiner*—Phuc T Dang
(74) *Attorney, Agent, or Firm*—Schmeiser, Olsen & Watts; Louis J. Percello

(57) ABSTRACT

A structure for reduction of soft error rates in integrated circuits. The structure including: a semiconductor substrate; and a stack of one or more wiring levels stacked from a lowermost wiring level to an uppermost wiring level, the lowermost wiring level nearer the semiconductor substrate than the uppermost wiring level; and an alpha particle blocking layer on a top surface of the uppermost wiring level of the one or more wiring levels, the blocking layer comprising metal wires and a dielectric material, the blocking layer having a combination of a thickness of the blocking layer and a volume percent of metal wires in the blocking layer sufficient to stop a predetermined percentage of alpha particles of a selected energy or less striking the blocking layer from penetrating into the stack of one or more wiring levels or the substrate.

15 Claims, 21 Drawing Sheets

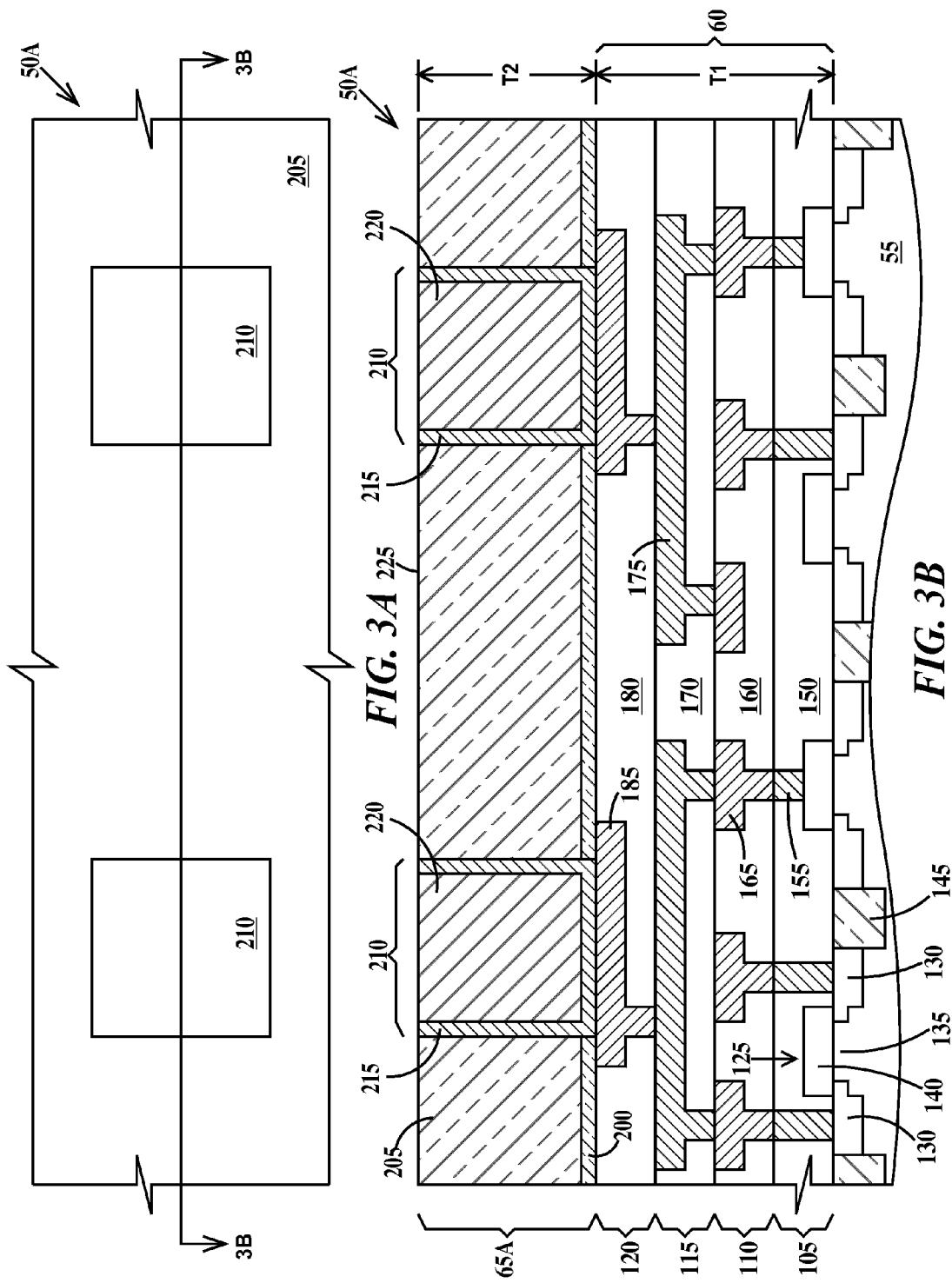

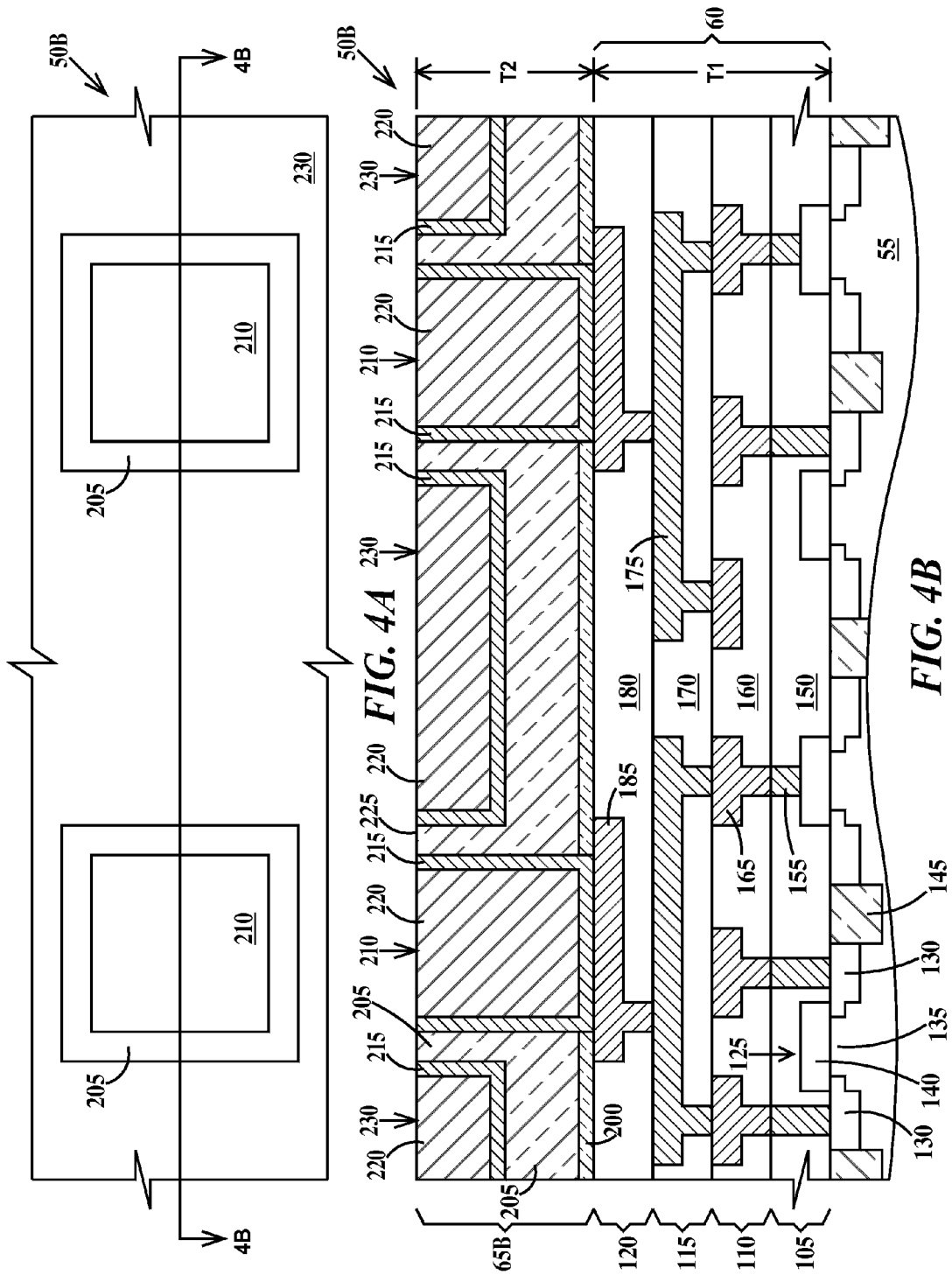

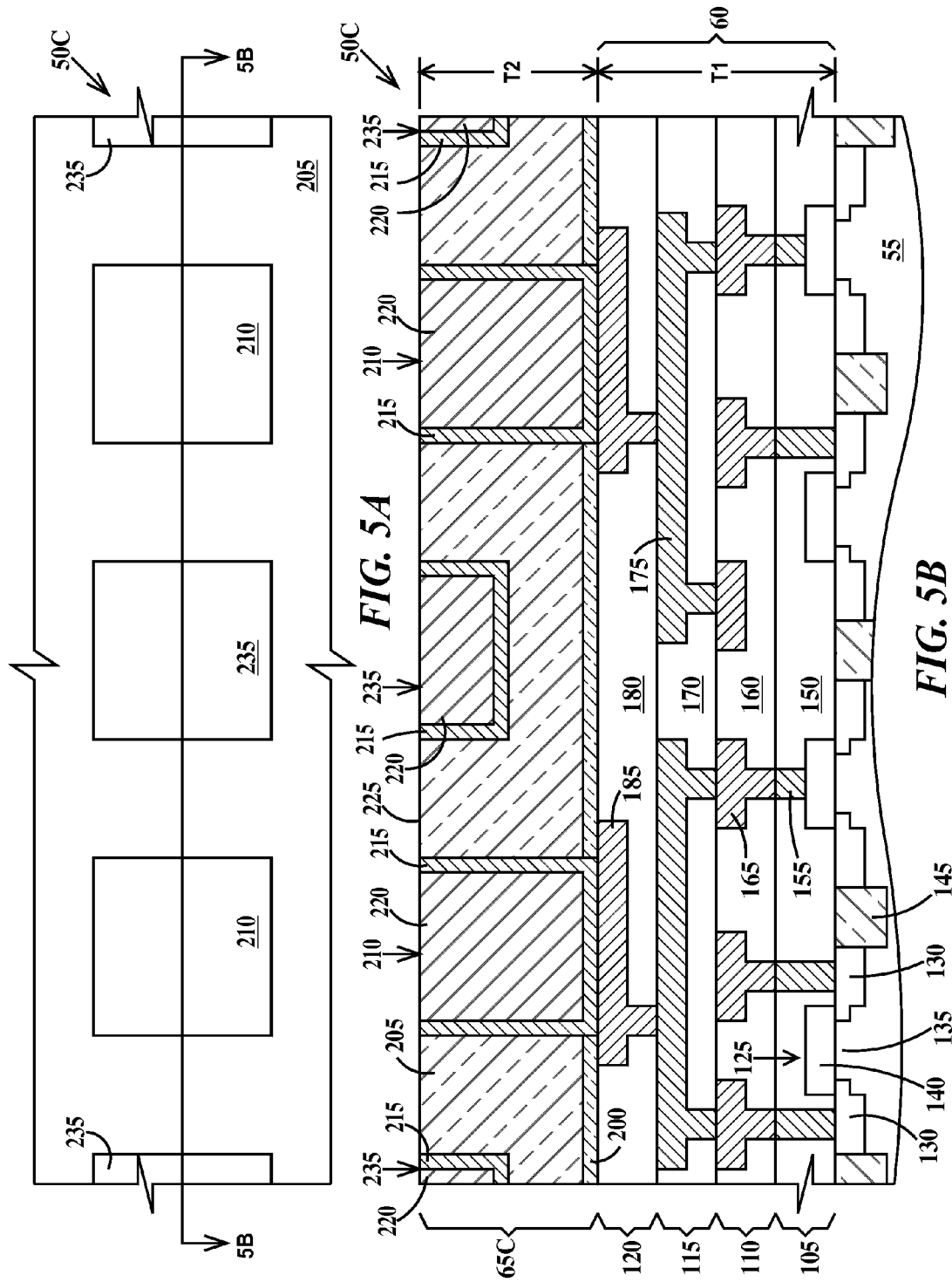

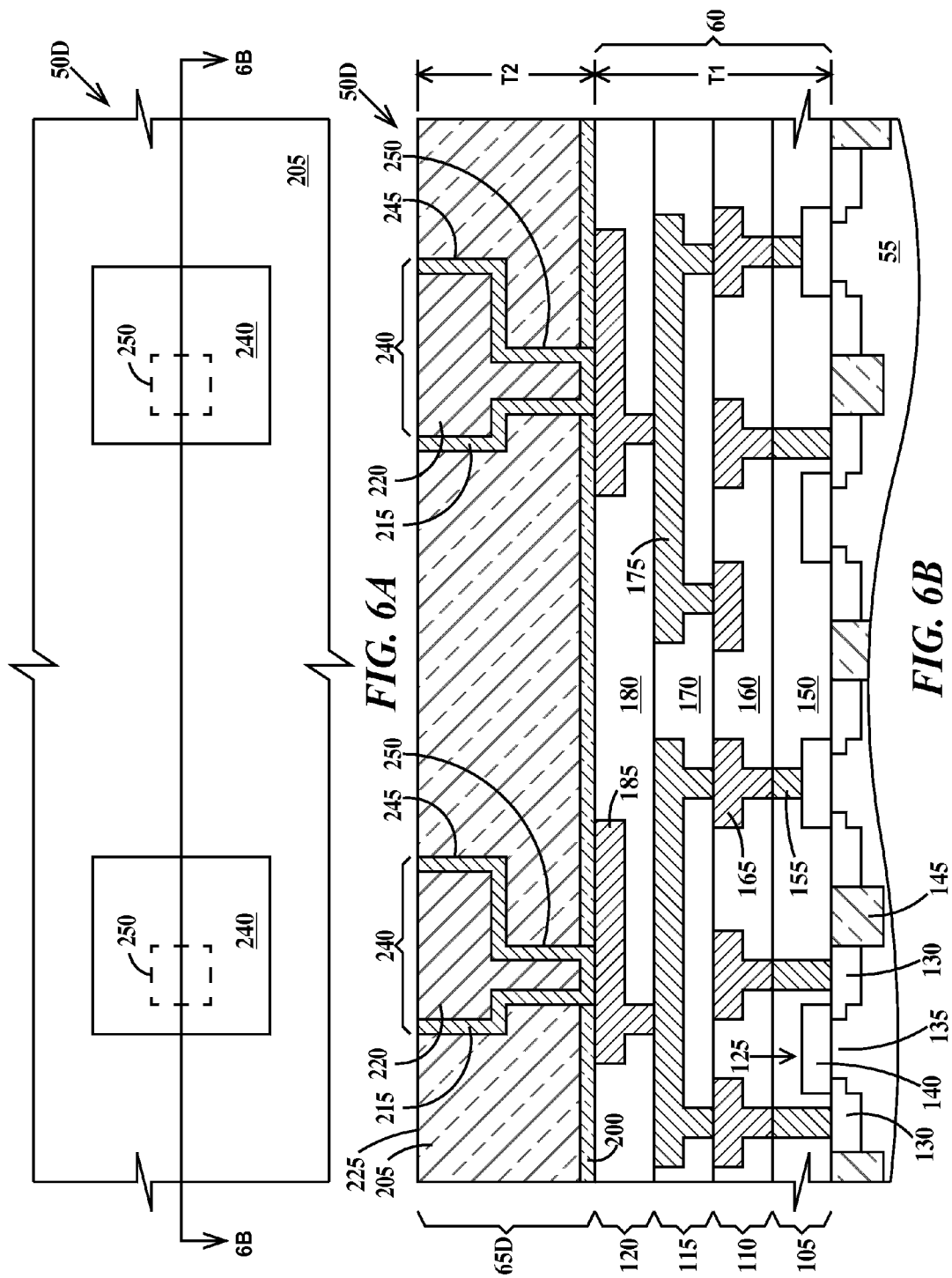

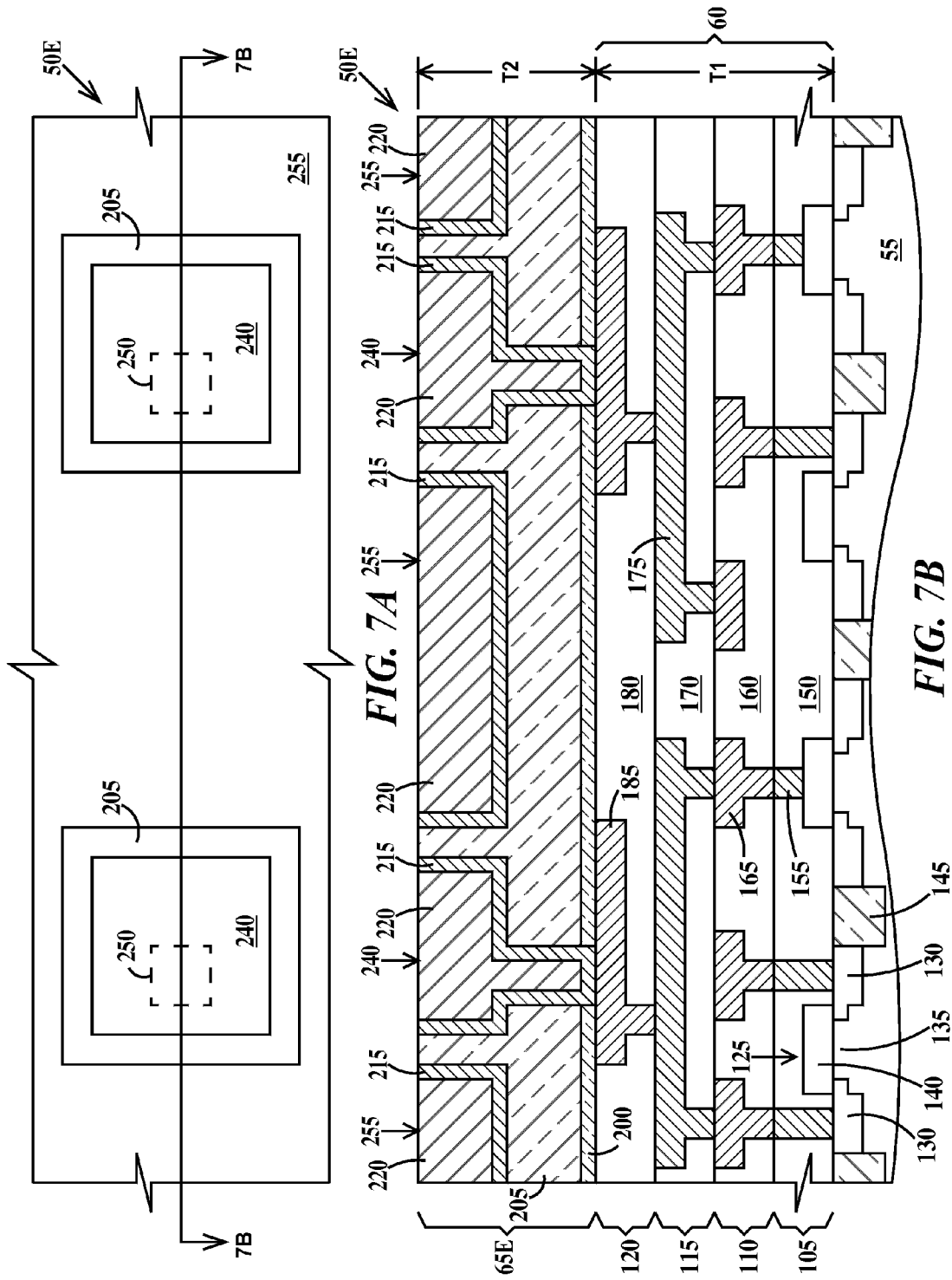

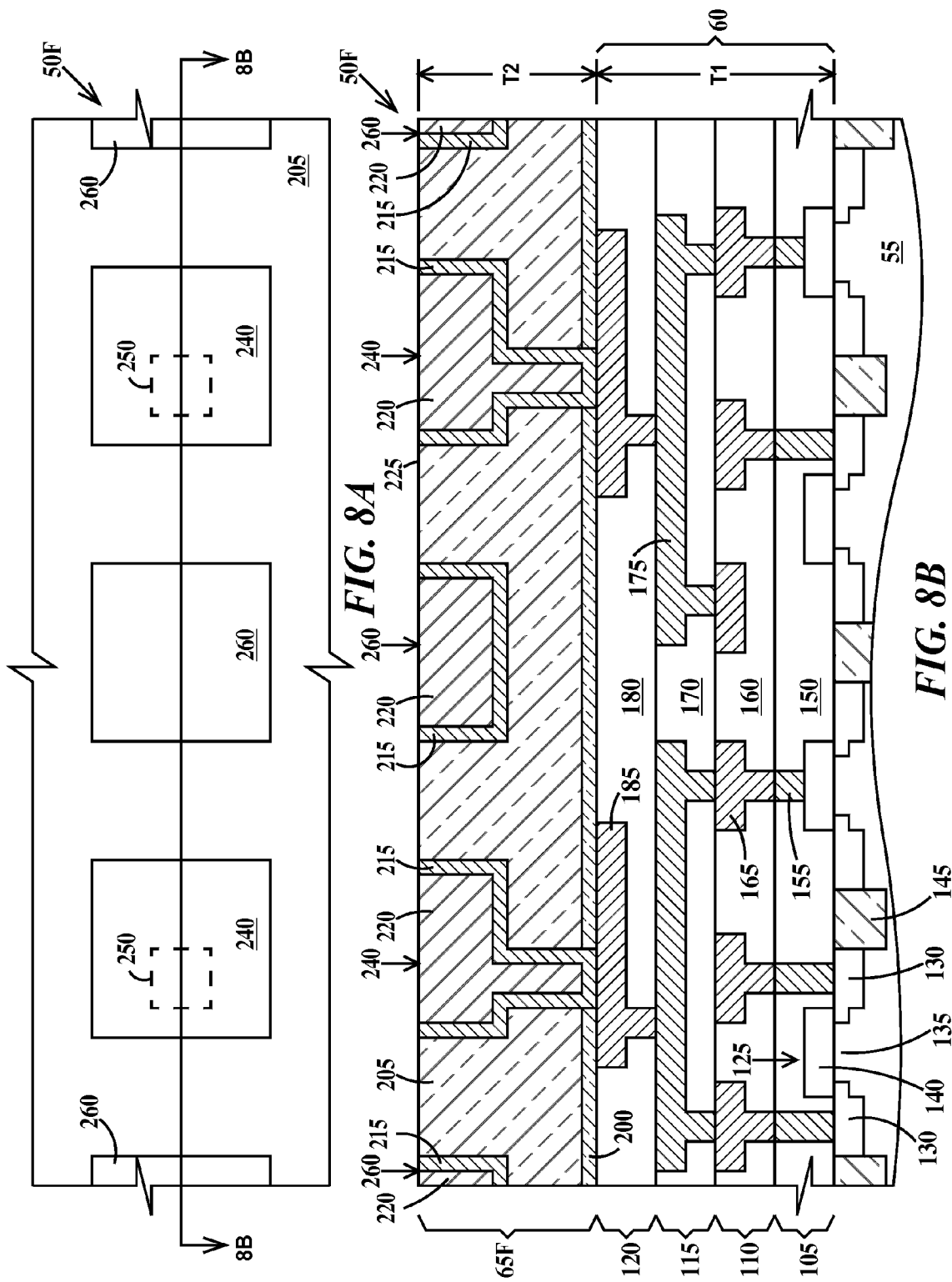

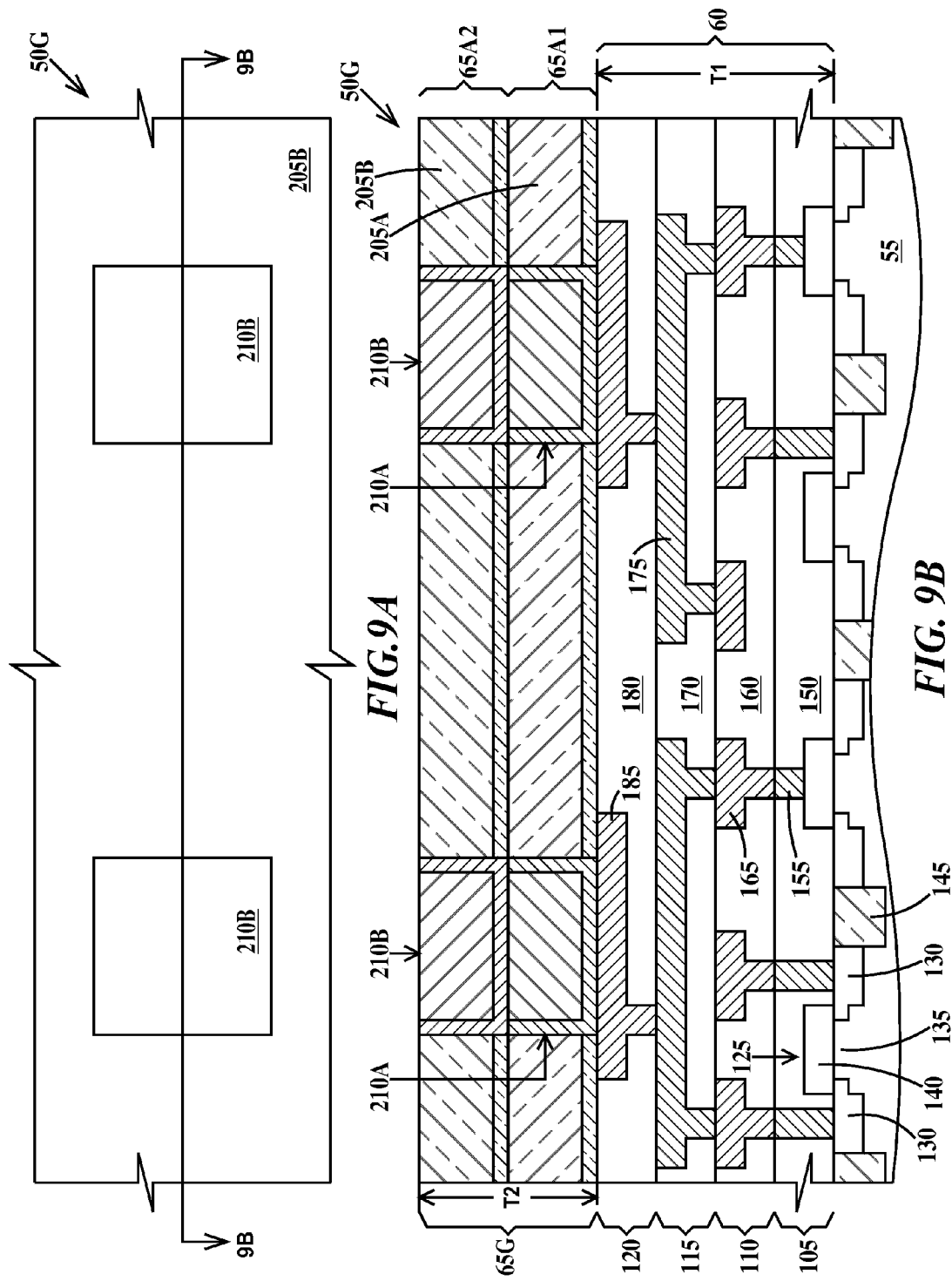

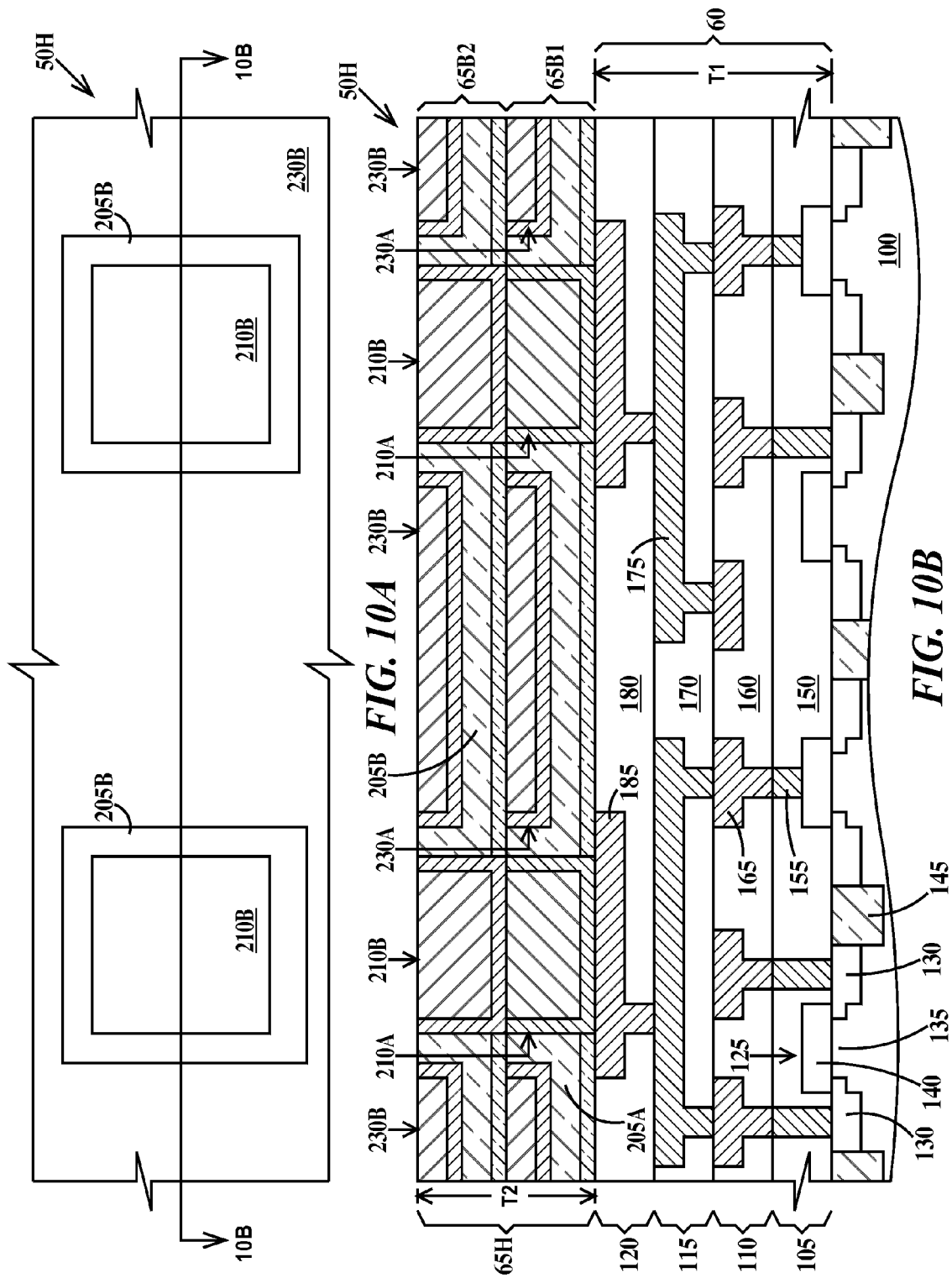

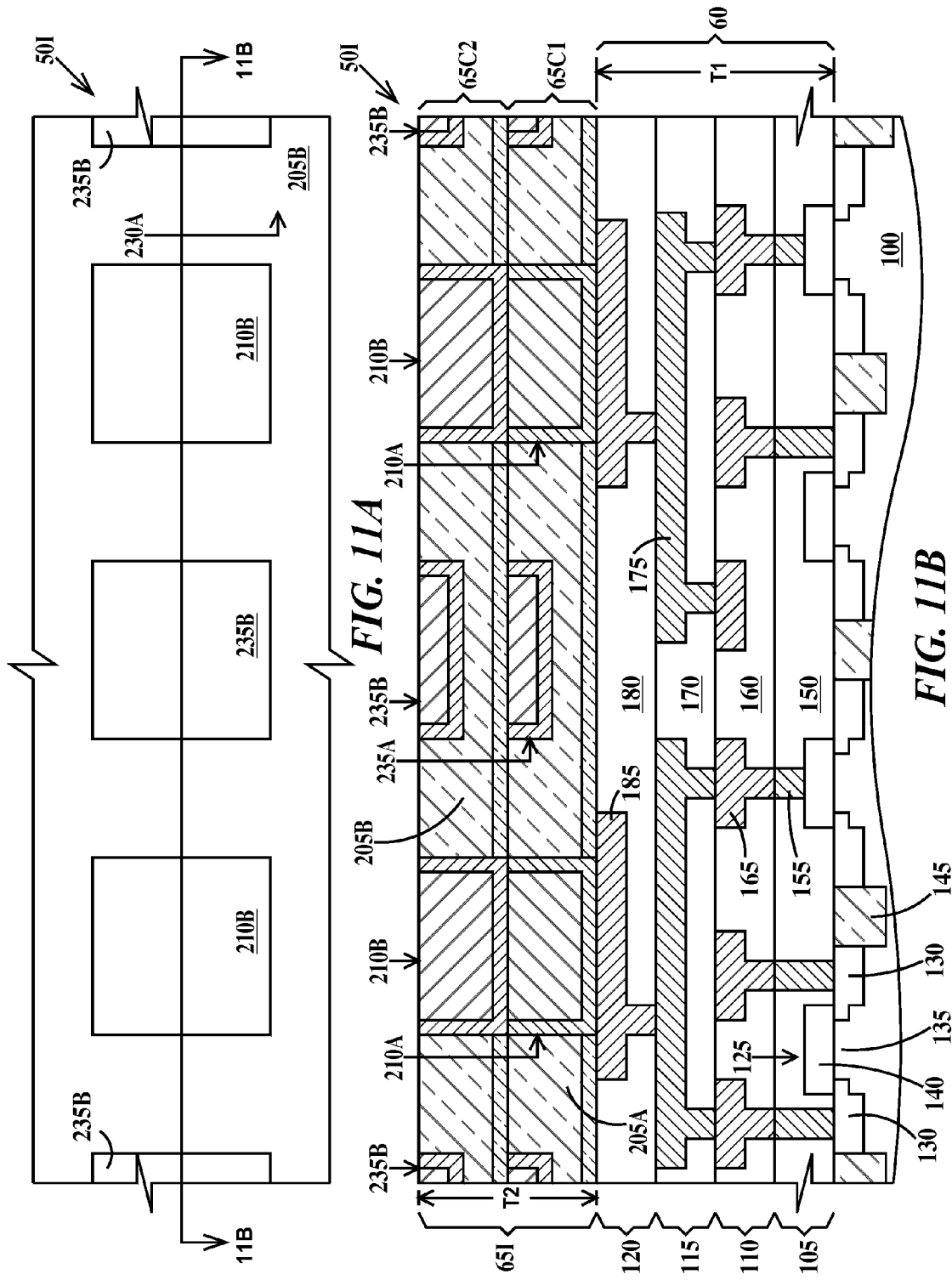

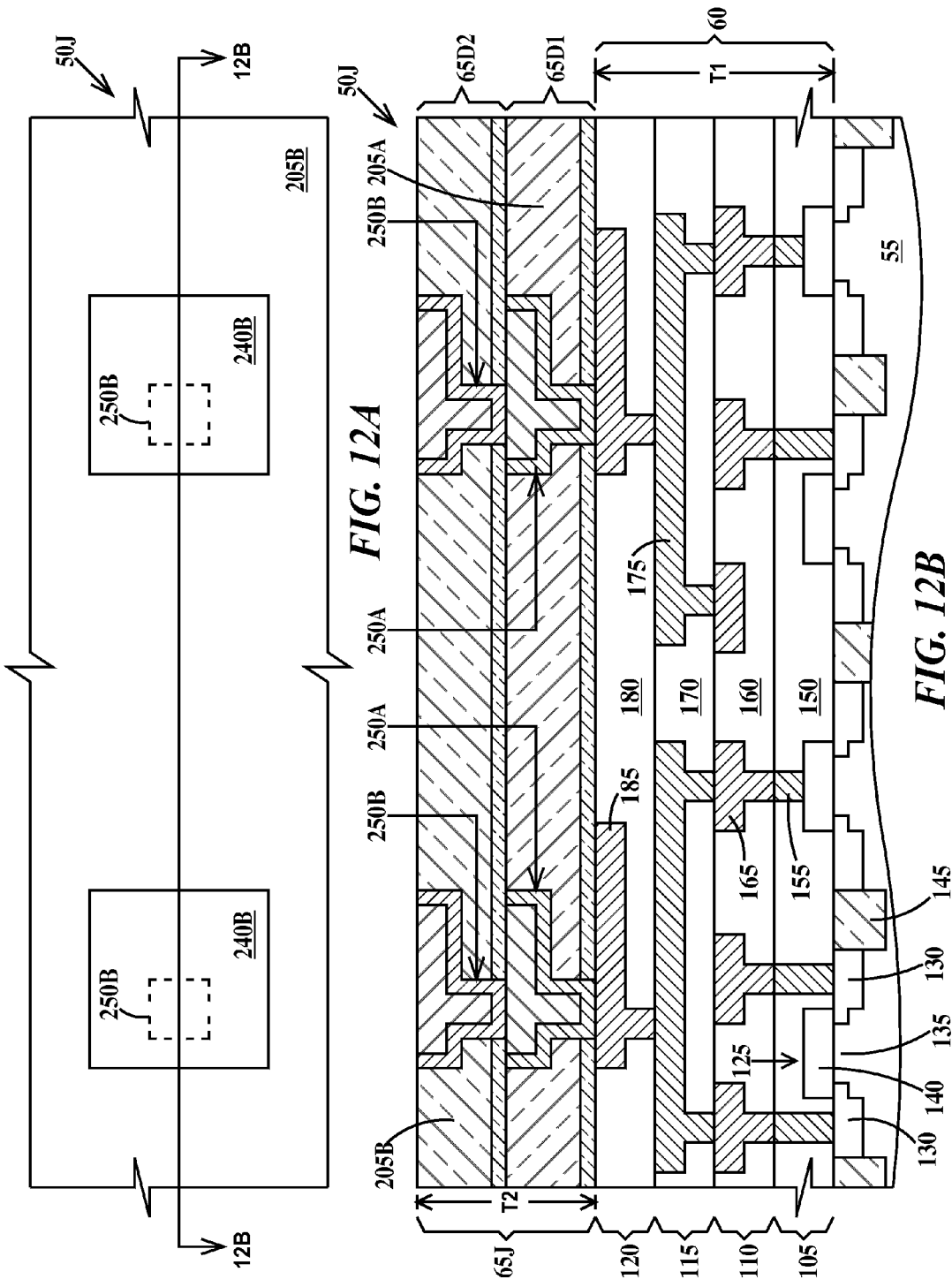

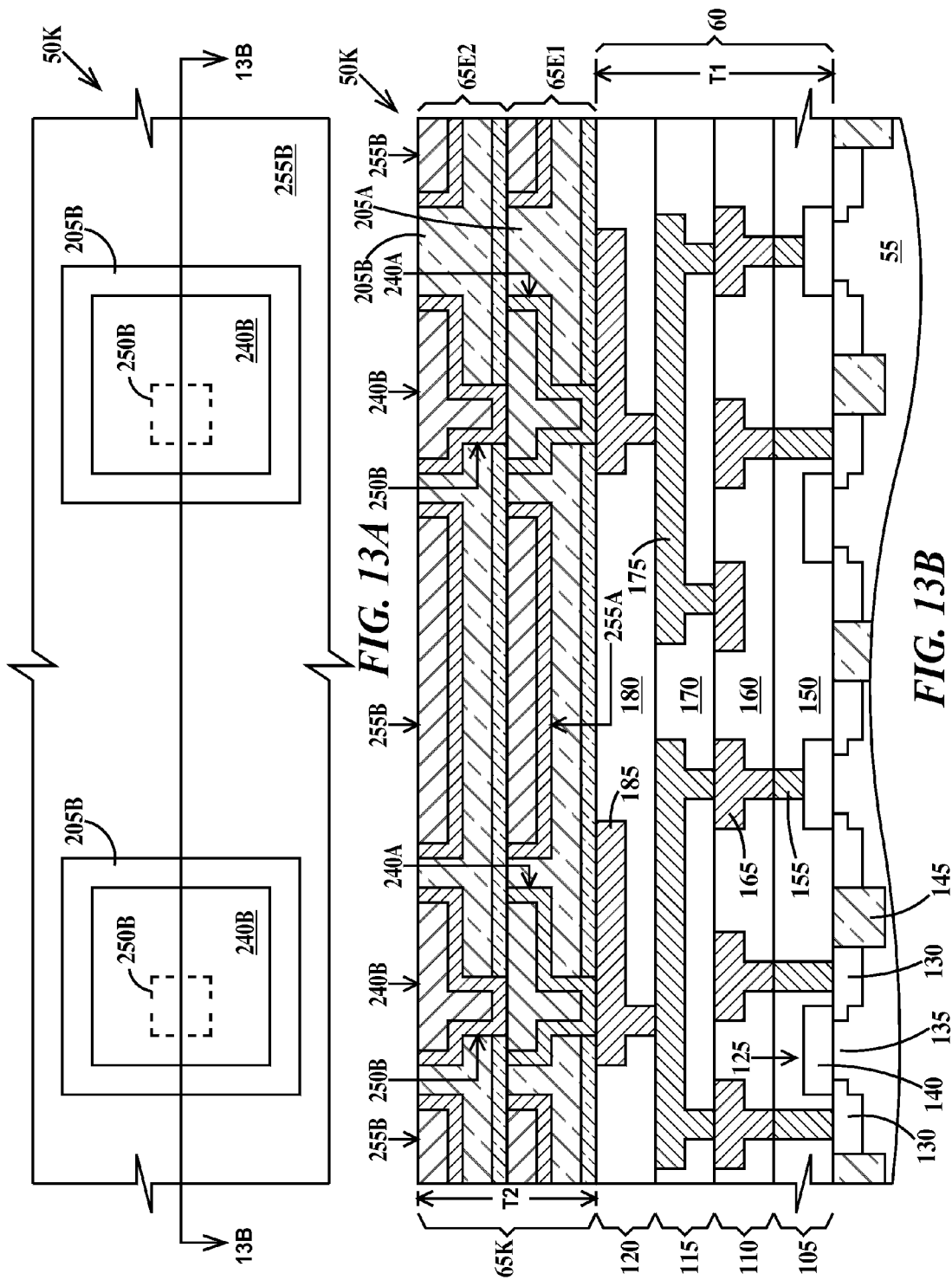

STRUCTURE FOR REDUCTION OF SOFT ERROR RATES IN INTEGRATED CIRCUITS

This application is a division of U.S. patent application Ser. No. 12/051,040 filed Mar. 19, 2008, U.S. Pat. No. 7,601,627 which is a division of U.S. patent application Ser. No. 11/183,647 filed on Jul. 18, 2005 and now U.S. Pat. No. 7,381,635 issued Jun. 3, 2008.

FIELD OF THE INVENTION

The present invention relates to the field of integrated circuits; more specifically, it relates to a method and a structure for the reduction of soft error rates in integrated circuits.

BACKGROUND OF THE INVENTION

Soft error rates in integrated circuits are caused by ionizing radiation, such as alpha particles passing through the semiconductor materials of the integrated circuit. Both logic and memory circuits may be effected. The errors are called "soft" because they generally only persist until the next cycle of the integrated circuit function. As an alpha particle passes through semiconductor material a "cloud" of hole-electron pairs are generated in the vicinity of its path. Electric fields present in the integrated circuit can cause the holes and electrons to migrate in opposite directions thus causing extra charge to reach particular circuit nodes and upset the function of the integrated circuit.

As integrated circuit devices continue to be scaled; capacitor cell sizes and operating voltages continue to decrease while circuit density increases. This causes an increase in the probability of an integrated circuit experiencing a soft error. Therefore, there is a need for improved methods and structures for reducing soft error rates in integrated circuits.

SUMMARY OF THE INVENTION

A first aspect of the present invention is a structure, comprising: an integrated circuit, comprising: a semiconductor substrate; and a stack of one or more wiring levels stacked from a lowermost wiring level to an uppermost wiring level, the lowermost wiring level nearer the semiconductor substrate than the uppermost wiring level; and an alpha particle blocking layer on a top surface of the uppermost wiring level of the one or more wiring levels, the blocking layer comprising metal wires and a dielectric material, the blocking layer having a combination of a thickness of the blocking layer and a volume percent of metal wires in the blocking layer sufficient to stop a predetermined percentage of alpha particles of a selected energy or less striking the blocking layer from penetrating into the stack of one or more wiring levels.

A second aspect of the present invention is the structure of the first aspect of the present invention, wherein the blocking layer includes terminal pads, each terminal pad connected to a corresponding wire in the uppermost wiring level.

A third aspect of the present invention is the structure of the first aspect of the present invention, the blocking layer further including dummy terminal pads, the dummy terminal pads interspersed with the terminal pads and not connected to each other or to any of the terminal pads or to any wires in the uppermost wiring level.

A fourth aspect of the present invention is the structure of the first aspect of the present invention, the blocking layer further including a metal shield having openings, the terminal pads positioned within the openings and the terminal not electrically contacting the shield.

A fifth aspect of the present invention is the structure of the first aspect of the present invention, wherein the predetermined percentage of alpha particles is about 99% or greater of the alpha particles of the selected energy and wherein the selected energy is equal to or less than about 10 MeV.

A sixth aspect of the present invention is the structure of the first aspect of the present invention, wherein the metal wires comprise a structure selected from the group consisting of a damascene wire, a damascene via, a damascene terminal pad, a dual damascene wire having one or more integral vias, a dual damascene terminal pad having one or more integral vias and combinations thereof.

A seventh aspect of the present invention is the structure of the first aspect of the present invention, wherein the metal wires comprise material selected from the group consisting of Ta, TaN, Ti, TiN, W, WN, Ru, Cu and combinations thereof and the dielectric material is selected from the group consisting of silicon dioxide, fluorinated silicon dioxide, polyimide, a low K material having a permittivity of 4 or less, hydrogen silsesquioxane polymer, methyl silsesquioxane polymer, polyphenylene oligomer, $SiO_x(CH_3)_y$, organosilicate glass, SiCOH, porous SiCOH, diamond-like carbon and combinations thereof.

An eighth aspect of the present invention is the structure of the first aspect of the present invention, wherein said combination of said thickness of said blocking layer and said volume percent of metal wires in said blocking layer is sufficient to stop said predetermined percentage of alpha particles of said selected energy or less striking said blocking layer from penetrating into said lowermost wiring level.

A ninth aspect of the present invention is the structure of the first aspect of the present invention, wherein said combination of said thickness of said blocking layer and said volume percent of metal wires in said blocking layer is sufficient to stop said predetermined percentage of alpha particles of said selected energy or less striking said blocking layer from penetrating into said substrate.

A tenth aspect of the present invention is the structure of the first aspect of the present invention, wherein the combination of the thickness of the blocking layer and the volume percent of metal wires in the blocking layer is sufficient to stop the predetermined percentage of alpha particles of the selected energy or less striking the blocking layer from penetrating into a structure comprising a semiconductor material formed in the integrated circuit chip.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

FIG. 3A is a top view and FIG. 3B is a cross-sectional view through line 3B-3B of FIG. 3A of an integrated circuit chip fabricated with an alpha particle blocking layer according to a first embodiment of the present invention;

FIG. 4A is a top view and FIG. 4B is a cross-sectional view through line 4B-4B of FIG. 4A of an integrated circuit chip fabricated with an alpha particle blocking layer according to a second embodiment of the present invention;

FIG. 5A is a top view and FIG. 5B is a cross-sectional view through line 5B-5B of FIG. 5A of an integrated circuit chip fabricated with an alpha particle blocking layer according to a third embodiment of the present invention;

FIG. 6A is a top view and FIG. 6B is a cross-sectional view through line 6B-6B of FIG. 6A of an integrated circuit chip fabricated with an alpha particle blocking layer according to a fourth embodiment of the present invention;

FIG. 7A is a top view and FIG. 7B is a cross-sectional view through line 7B-7B of FIG. 7A of an integrated circuit chip fabricated with an alpha particle blocking layer according to a fifth embodiment of the present invention;

FIG. 8A is a top view and FIG. 8B is a cross-sectional view through line 8B-8B of FIG. 8A of an integrated circuit chip fabricated with an alpha particle blocking layer according to a sixth embodiment of the present invention;

FIG. 9A is a top view and FIG. 9B is a cross-sectional view through line 9B-9B of FIG. 9A of an integrated circuit chip fabricated with an alpha particle blocking layer according to a seventh embodiment of the present invention;

FIG. 10A is a top view and FIG. 10B is a cross-sectional view through line 10B-10B of FIG. 10A of an integrated circuit chip fabricated with an alpha particle blocking layer according to an eighth embodiment of the present invention;

FIG. 11A is a top view and FIG. 11B is a cross-sectional view through line 11B-11B of FIG. 11A of an integrated circuit chip fabricated with an alpha particle blocking layer according to a ninth embodiment of the present invention;

FIG. 12A is a top view and FIG. 12B is a cross-sectional view through line 12B-12B of FIG. 12A of an integrated circuit chip fabricated with an alpha particle blocking layer according to a tenth embodiment of the present invention;

FIG. 13A is a top view and FIG. 13B is a cross-sectional view through line 13B-13B of FIG. 13A of an integrated circuit chip fabricated with an alpha particle blocking layer according to an eleventh embodiment of the present invention;

DETAILED DESCRIPTION OF THE INVENTION

A single damascene process (or simply a damascene process) is one in which wire trench or via openings are formed in a dielectric layer, an electrical conductor deposited on a top surface of the dielectric of sufficient thickness to fill the trenches and a chemical-mechanical-polish (CMP) process performed to remove excess conductor and make the surface of the conductor co-planer with the surface of the dielectric layer to form damascene wires (or damascene vias).

A dual damascene process is one in which via openings are formed through the entire thickness of a dielectric layer followed by formation of trenches part of the way through the dielectric layer in any given cross-sectional view. Alternatively, the trenches may be formed first. All via openings are intersected by integral wire trenches above and by a wire trench below, but not all trenches need intersect a via opening. An electrical conductor is deposited on a top surface of the dielectric of sufficient thickness to fill the trenches and via opening and a CMP process performed to make the surface of the conductor in the trench co-planer with the surface the dielectric layer to form dual damascene wire and dual damascene wires having integral dual damascene vias.

The present invention utilizes alpha particle blocking layer (s) (hereinafter blocking layer(s)) formed by damascene or dual damascene process. An exemplary dual damascene process is illustrated in FIGS. 18A through 18F and described infra.

Figure 1:
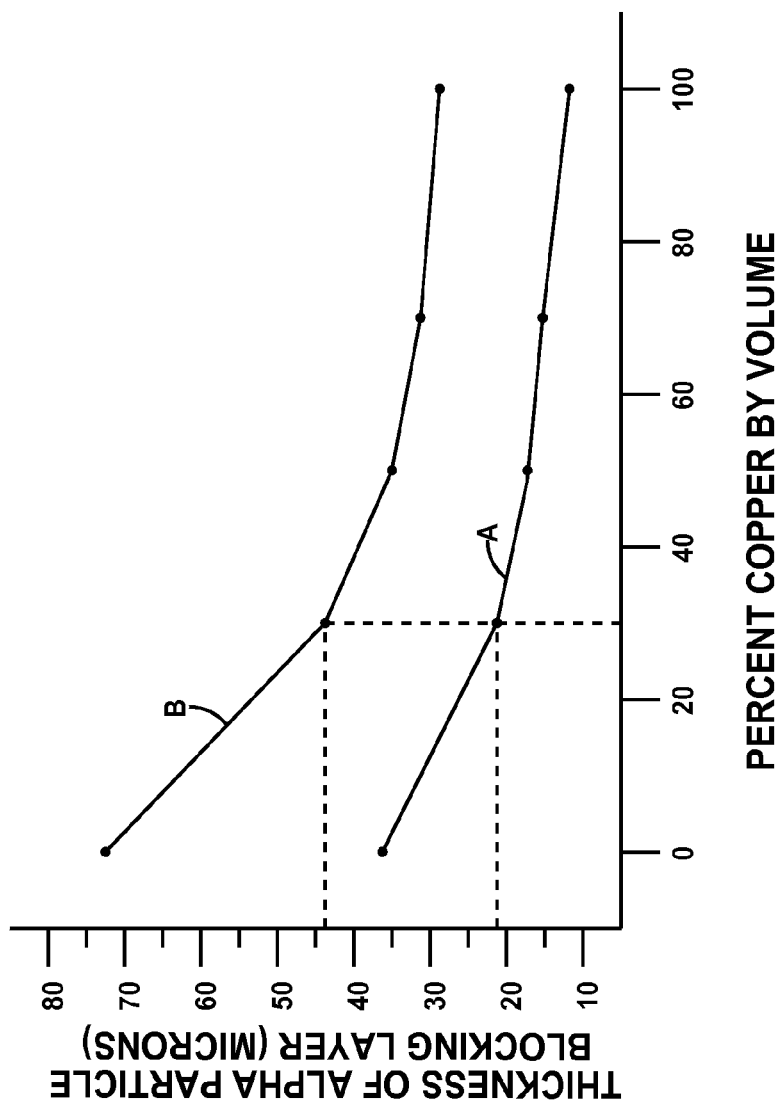
FIG. 1 is a chart of thickness of an alpha particle blocking layer required to stop alpha particles of two energies as a function of percent copper by volume in a silicon dioxide layer.

FIG. 1 is a chart of thickness of an alpha particle blocking layer required to stop alpha particles of two energies as a function of percent copper by volume in a silicon dioxide layer. The volume percent of conductor in the blocking layer may be determined from knowledge of the pattern density of the wire mask and via mask used to fabricate the blocking layer and the thickness of the blocking layer dielectric layer and the thickness of the wires and vias.

When alpha particles of the same energy strike the surface of a material and then enter the material they continuously loose energy and change direction by collisions with atoms in the material until they stop traveling. The mean distance alpha particles of a given energy travel in the material is known as the range. The $1\sigma$ distribution about this mean is known as straggling. About 99% of the alpha particles stop in the distance that is the sum of the range and three times the straggle. The sum of the range and three times the straggle is known as the total range. In FIG. 1, curve A is a plot of total range (expressed as a thickness of a layer of copper (Cu) in silicon dioxide ($SiO_2$) as a function of the percent of copper) of 5.5 MeV alpha particles. One MeV (mega-volt) is the energy imparted to a charged particle having a charge of 1 electron unit (eu) or about $1.602 \times 10^{-19}$ coulomb as it is accelerated by a voltage of 1 MV, or $E=qV$.

Curve B is a plot of total range (expressed as a thickness of a layer of copper in silicon dioxide as a function of the percent of copper) of 8.8 MeV alpha particles. Similar curves for any alpha particle energy specifying a predetermined percentage those alpha particles within the layer can be prepared using any number of simulation models available. One example of a simulation model is "The Stopping and Range of Ions in Matter" (SRIM); © 2003 J. F. Ziegler, J. P. Biersack (SRIM-.com). The inputs to this model are type of ion (i.e. He), energy (MeV), target elements (i.e. $SiO_2$ and Cu) and the outputs are projected range (um) and straggle (um). This model assumes that the copper is distributed uniformly through out the $SiO_2$ dielectric.

An example of one use the chart of FIG. 1 follows. In an example of a blocking layer of 30% copper in silicon dioxide on the surface of a substrate, a thickness of about 22 microns is required to stop 5.5 MeV alpha particles (curve A) and about 44 microns (curve B) to stop 8.8 MeV alpha particles within the blocking layer. However, if a 30% by volume copper in silicon dioxide blocking layer was to be formed on top of the last or uppermost wiring level of an integrated circuit chip that itself was comprised of a total thickness of about 10 microns of 30% by volume copper in silicon dioxide wiring levels, then the blocking layer would need to be about 34 microns thick to stop 5.5 MeV and 8.8 MeV alpha particles within the blocking layer or the wiring levels. In other words, the normal wiring levels may block some of the alpha particles.

Looking at the extremes of curves A and B, it can be seen that a 100% silicon dioxide layer formed on a substrate would need to be about 36 microns to stop 5.5 MeV alpha particles within the blocking layer and about 73 microns thick to stop 8.8 MeV alpha particles within the blocking layer. At the other extreme of curves A and B, it can be seen that a 100% copper layer formed on a substrate would need to be about 12 microns thick to stop 5.5 MeV alpha particles and about 24 microns thick to stop 8.8 MeV alpha particles within the blocking layer.

Thickness values obtained from curves A and B assure that at least about 99% (if not all) of alpha particles of the corresponding energies are stopped in the thickness indicated. In a damascene or dual damascene process, conductive structures (vias, via bars, wires) yielding a selected copper volume percent are embedded in an interlevel dielectric as described supra to form a blocking layer according to the present invention.

Figure 19:
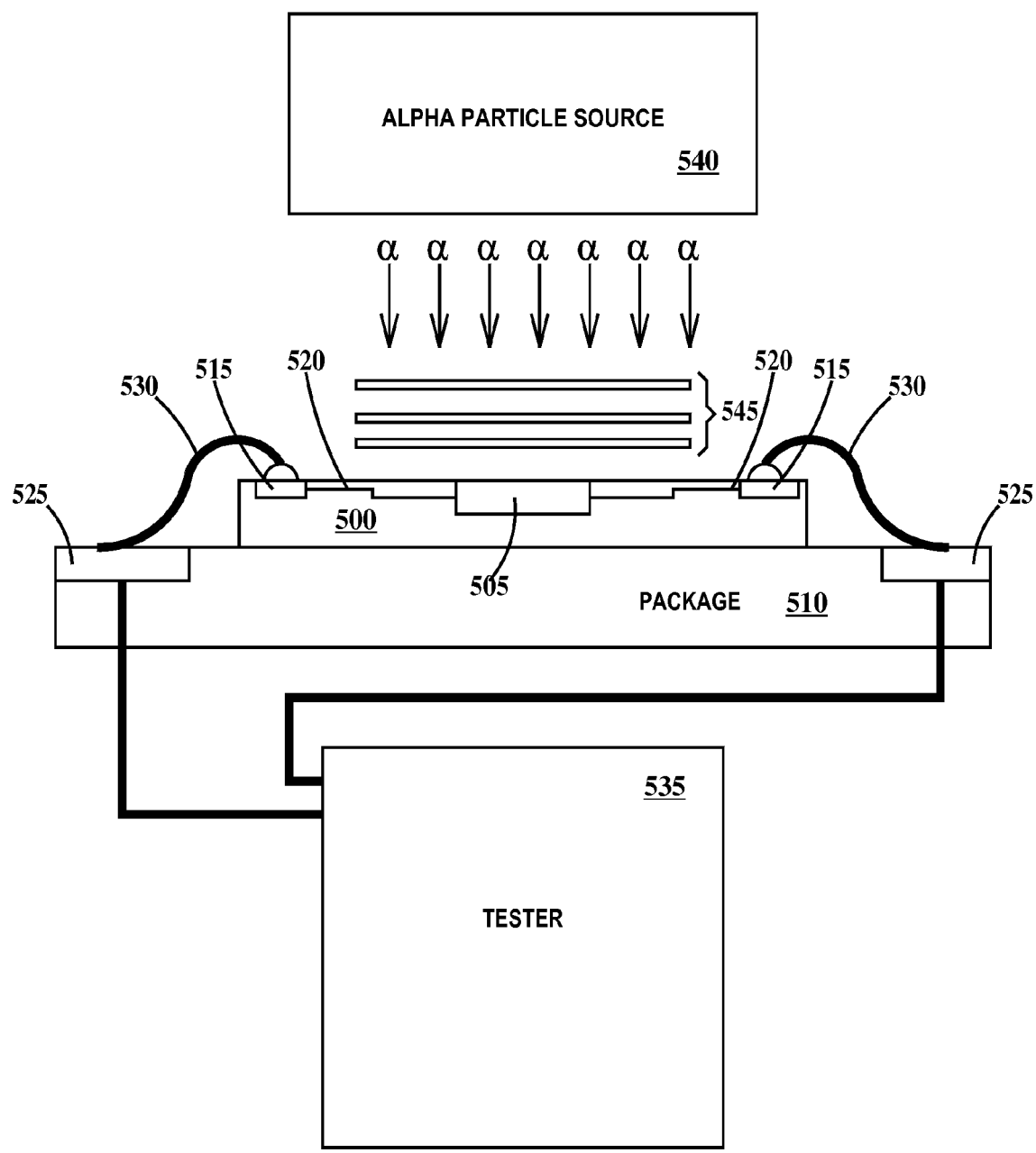
FIG. 19 is a diagram illustrating a method for determining the thickness/metal volume percent for alpha particle blocking layers according to the embodiments of the present invention.

The chart of FIG. 1 was generated by simulation modeling using the model referenced supra. Similar curves may be generated experimentally in a method as illustrated in FIG. 19 as described infra. Simulations using higher Z (atomic number) metal, for example tantalum only reduced the required thickness of the blocking layers by about 2 microns to about 3 microns.

Figure 2:
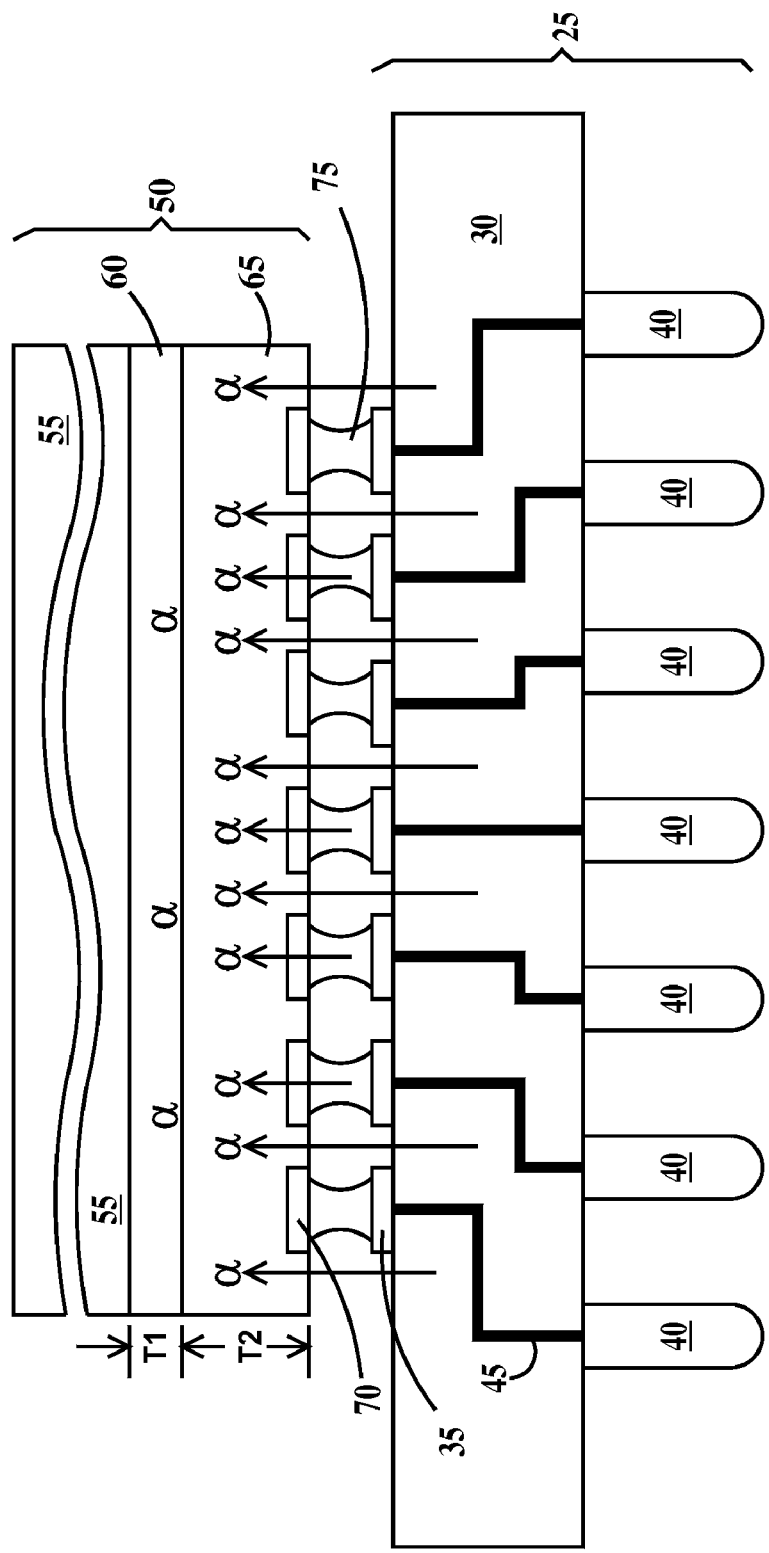
FIG. 2 is a diagram illustrating an integrated circuit chip having an alpha particle blocking layer fabricated according to any of the embodiments of the present invention flip-chip mounted to an exemplary substrate.

FIG. 2 is a diagram illustrating an integrated circuit chip fabricated with a blocking layer according to any of the embodiments of the present invention flip-chip mounted to an exemplary substrate. In FIG. 2, a package substrate 25 includes a body 30, pads 35 on a first surface and pins 40 on a second surface opposite the first surface electrically connected by wires 45 internal to body 30. Body 30 may comprise a single or multiple ceramic layers or organic layers, the layers including conductive wires. An integrated circuit chip 50 includes a semiconductor substrate 55, wiring levels 60 containing one or more levels of wires (not shown) formed on and electrically connecting wires (not shown) in the wiring level to devices (not shown) formed in the substrate, a blocking layer 65 containing one or more blocking layers formed on and electrically connecting wires (not shown) in the blocking layer to wires (not shown) in wiring levels 60 and terminal pads 70 formed in blocking layer 65 and electrically connected to wires (not show) in blocking layer 65. More detailed examples of integrated circuit chip 50 are described infra. Pads 35 of package substrate 25 are mechanically and electrically connected to terminal pads 70 of integrated circuit chip 50 by solder bumps 75. Solder bumps 75 are also known as controlled collapse chip connections (C4s).

There are two potential sources of alpha particles in FIG. 2. In the case that body 30 comprises a ceramic material, body 30 may contain radioactive thorium (Th) and uranium (U) isotopes that may emit alpha particles with energy of less than about 10 MeV. In the example the solder bumps are lead (Pb), tin (Sn) or a combination of Pb and Sn, the solder bumps may contain radioactive polonium (Po) and Pb isotopes that may emit about 5.5 MeV alpha particles. While the quantities of radioactive Th, U, Po and Pb may be in the parts-per-billion (ppb) range, the flux of alpha particles emitted may be sufficient to cause soft-error rates that exceed the allowable maximum for advanced integrated logic and memory circuits if the alpha particles are allowed to penetrate into semiconductor substrate 55 which may include the silicon portions of active devices (examples of which include field effect and bipolar transistors) that can be sensitive to alpha particles-induced upsets, or into portions of the active devices above the surface of the substrate and containing semiconductor materials, such as polysilicon gates of field effect transistors.

Wiring levels 60 have a thickness T1 and blocking layer 65 has a thickness T2. The total range of energetic alpha particles, see FIG. 1, is generally far greater than the value of T1 for currently fabricated integrated circuit chips. For example, assuming 10 wiring levels averaging 50% copper by volume and having an average thickness of about 1 micron would yield a T1 of 10 microns which is substantially smaller than the range of even the 5.5 MeV alpha particles shown in curve A of FIG. 1. Thus the need for blocking layer 65.

In a first example, T2 is chosen such that the combination of the value of T2 and the volume percent of metal in blocking layer 65 results in a predetermined percentage of alpha particles penetrating the top surface of the blocking layer 65 being stopped within the blocking layer.

In a second example, T2 is chosen such that the combination of the value of T2, the value of T1, the volume percent of metal in wiring levels 60, and the volume percent of metal in blocking layer 65 results in a predetermined percentage of alpha particles being stopped in the wiring levels and not penetrating into the substrate 55. In a third example, T2 is chosen such that the combination of the value of T2, the value of T1, the volume percent of metal in wiring levels 60, the value of T2 and the volume percent of metal in blocking layer 65 results in a predetermined percentage of alpha particles having a selected energy being stopped before striking any structures comprised of semiconductor material formed between substrate 55 and blocking layer 65, for example, before striking polysilicon gate electrodes.

In one example, the selected alpha particle energies are about 5.5 MeV or about 8.8 MeV representing the alpha particle energy from $^{210}$Po or the maximum energy from Th or U. In another example, the alpha particle energies are less than about 10 MeV. In yet another example, the selected energies may be based on the physical design of substrate 55 including the active devices. In one example, the predetermined percentage of alpha particles stopped may be based on the reliability specification of the integrated circuit.

It should be understood, the embodiments of the present invention described infra, do not require a package as illustrated in FIG. 2 or that the source of alpha particles be from a package to which the integrated circuit is mounted.

The designation of integrated circuits as 50A, 50B, etc and of blocking layers as 65A, 65B, etc. in the following descriptions should be understood to indicate that they may replace, respectively, integrated circuit 50 and blocking layer 65 of FIG. 2.

FIG. 3A is a top view and FIG. 3B is a cross-sectional view through line 3B-3B of FIG. 3A of an integrated circuit chip fabricated with a blocking layer according to a first embodiment of the present invention. In FIG. 3B, an integrated circuit chip 50A includes substrate 55, wiring levels 60 and a blocking layer 65A. In a first example, substrate 55 may comprise a bulk silicon substrate. In a second example, substrate 55 may comprise a silicon-on-insulator (SOI) substrate. Wiring levels 60, having thickness T1, comprises individual wiring levels 105, 110, 115 and 120. Substrate 55 includes a multiplicity of field effect transistors (FETs) 125, each including source/drains 130 formed in substrate 55 and a channel region 135 formed in substrate 55 between source/drains 130 and under a gate electrode 140. There is also a gate dielectric layer (not shown) between gate electrode 140 and substrate 55.

Wiring level 105 includes a dielectric layer 150 in which damascene contacts 155 are formed. Wiring level 110 includes a dielectric layer 160 in which dual damascene wires 165 are formed. Wiring level 115 includes a dielectric layer 170 in which dual damascene wires 175 are formed. Wiring level 120 includes a dielectric layer 180 in which dual damascene wires/pads 185 are formed. While wiring levels 60 includes four wiring levels, four should be considered as exemplary and any number of wiring levels may be present. Contacts 155 and wires 165 and 175 and wire/pad 185 interconnect FETs 125 and any other devices that may be present in substrate 55 (for example, capacitors and resistors) or present with any given wiring level (for example, capacitors, resistors and inductors) into integrated circuits.

Blocking layer 65A, having thickness T2 includes an optional first dielectric layer 200 formed on top of wiring level 120 and a second dielectric layer 205 formed on top of the first dielectric layer. Damascene terminal pads 210, comprising an optional conductive liner 215 and a core conductor 220 are formed in blocking layer 65A and extend from a top surface 225 of the blocking layer to wire/pads 185 in wiring level 120, to which wires 210 make electrical contact. In a first example, wire/pads 185 are terminal pads of a fully functional integrated circuit chip and blocking layer 65A is formed by performing additional processing. In a second example, wire/pads 185 are wires and the integrated circuit chip is not fully functional until the blocking layer is added.

In one example, conductive liner 215 comprises Ta, TaN, Ti, TiN, W, WN, Ru combinations thereof and core conductor 220 comprises copper, tungsten, aluminum or combinations thereof.

In one example, first dielectric layer 200 comprises silicon nitride ($Si_3N_4$), silicon carbide (SiC), silicon oxy nitride (SiON), silicon oxy carbide (SiOC), organosilicate glass (SiCOH), plasma-enhanced silicon nitride ($PSiN_x$), NBLok (SiC(N,H)) or combinations thereof. First dielectric layer 200 may be, for example, about 50 nm to about 1 µm thick. In one example, dielectric layer 200 is a diffusion barrier to copper.

In a first example, second dielectric layer 205 comprises $SiO_2$, polyimide, organosilicate glass, diamond-like carbon or combinations thereof. In a second example, second dielectric layer 205 comprises a low K (dielectric constant) material, examples of which include but are not limited to hydrogen silsesquioxane polymer (HSQ), methyl silsesquioxane polymer (MSQ), SiLK™ (polyphenylene oligomer) manufactured by Dow Chemical, Midland, Tex., Black Diamond™ ($SiO_x(CH_3)_y$,) manufactured by Applied Materials, Santa Clara, Calif., organosilicate glass (SiCOH), porous SiCOH, fluorinated silicon dioxide (FSG) or combinations thereof. A low K dielectric material has a relative permittivity of 4 or less.

FIG. 4A is a top view and FIG. 4B is a cross-sectional view through line 4B-4B of FIG. 4A of an integrated circuit chip fabricated with a blocking layer according to a second embodiment of the present invention. In FIG. 4B an integrated circuit chip 50B is similar to integrated circuit chip 50A of FIG. 3B except a damascene shield 230 comprising conductive liner 215 and core conductor 220 is formed in a blocking layer 65B and surrounds terminal pads 210 (see also FIG. 4A). Terminal pads 210 and shield 230 may be fabricated by the same damascene process or by separate damascene processes. Shield 230 is illustrated as not electrically connected to terminal pads 210 and not extending all the way through dielectric layers 200 and 205 to dielectric wiring level 120 or through dielectric layer 205 in the case that dielectric layer 200 is not present. Optionally, shield 230 may be connected to a terminal pad 210 in order to ground the shield or for other purposes.

FIG. 5A is a top view and FIG. 5B is a cross-sectional view through line 5B-5B of FIG. 5A of an integrated circuit chip fabricated with a blocking layer according to a third embodiment of the present invention. In FIG. 5B an integrated circuit chip 50C is similar to integrated circuit chip 50A of FIG. 3B except damascene dummy pads 235 comprising conductive liner 215 and core conductor 220 are formed in a blocking layer 65C between terminal pads 210 (see also FIG. 5A). Terminal pads 210 and dummy pads 235 may be fabricated by the same damascene process or by separate damascene processes. Dummy pads 235 are not electrically connected to terminal pads 210 and do not extend all the way through dielectric layers 200 and 205 to dielectric wiring level 120 or through dielectric layer 205 in the case that dielectric layer 200 is not present. Dummy pads 235 serve to increase the uniformity of the CMP process used to form the blocking layer 65C.

FIG. 6A is a top view and FIG. 6B is a cross-sectional view through line 6B-6B of FIG. 6A of an integrated circuit chip fabricated with a blocking layer according to a fourth embodiment of the present invention. In FIG. 6B an integrated circuit chip 50D is similar to integrated circuit chip 50A of FIG. 3B except damascene terminal pads 210 of FIG. 3B are replaced with dual damascene terminal pads 240 having a terminal pad region 245 and an integrally formed via region 250 formed in a blocking layer 65D. Terminal pads 240 comprise conductive liner 215 and core conductor 220.

FIG. 7A is a top view and FIG. 7B is a cross-sectional view through line 7B-7B of FIG. 7A of an integrated circuit chip fabricated with a blocking layer according to a fifth embodiment of the present invention. In FIG. 7B an integrated circuit chip 50E is similar to integrated circuit chip 50D of FIG. 6B except a damascene shield 255 comprising conductive liner 215 and core conductor 220 is formed in a blocking layer 65E and surrounds terminal pads 240 (see also FIG. 7A). Terminal pads 240 and shield 255 may be fabricated by the same dual damascene process, via regions 250 being defined by one etch process and pad regions 240 and shield 255 being defined by another etch process. Shield 255 is illustrated as not electrically connected to terminal pads 240 and does not extend all the way through dielectric layers 200 and 205 to dielectric wiring level 120 or through dielectric layer 205 in the case that dielectric layer 200 is not present. Optionally, shield 255 may be connected to a terminal pad 240 or to a wire/pad 185 of wiring level 120 by a dual damascene via in order to ground it or for other purposes.

FIG. 8A is a top view and FIG. 8B is a cross-sectional view through line 8B-8B of FIG. 8A of an integrated circuit chip fabricated with a blocking layer according to a sixth embodiment of the present invention. In FIG. 8B an integrated circuit chip 50F is similar to integrated circuit chip 50D of FIG. 6B except damascene dummy pads comprising conductive liner 215 and core conductor 220 are formed in a blocking layer 65F between terminal pads 240 (see also FIG. 5A). Terminal pads 240 and dummy pads 260 may be fabricated by the same dual damascene process, via regions 250 being defined by one etch process and pad regions 240 and dummy pads 260 being defined by another etch process. Dummy pads 260 are not electrically connected to terminal pads 240 and do not extend all the way through dielectric layers 200 and 205 to dielectric wiring level 120 or through dielectric layer 205 in the case that dielectric layer 200 is not present. Dummy pads 260 serve to increase the uniformity of the CMP process used form blocking layer 65F.

Returning to FIG. 2, the thickness T2 can be great enough to present processing problems if only one blocking layer is used. For example, T1 may be about 8 to about 10 microns and T2 may be about 20 to about 70 microns. Therefore blocking layer 65 may itself comprise two or more blocking layers as described infra.

FIG. 9A is a top view and FIG. 9B is a cross-sectional view through line 9B-9B of FIG. 9A of an integrated circuit chip fabricated with a blocking layer according to a seventh embodiment of the present invention. In FIG. 9B, an integrated circuit chip 50G includes a blocking layer 65G comprising a lower blocking layer 65A1 and an upper wiring level 65A2 on lower blocking layer 65A1. Lower blocking layer 65A1 includes terminal pads 210A and upper blocking layer 65A2 includes terminal pads 210B. Each terminal pad 210A is in electrical contact with a corresponding terminal pad 210B and each terminal pad 210A is in electrical contact with a corresponding wire/pad 185. Blocking layers 65A1 and 65A2 are similar to blocking layer 65A of FIG. 3B and terminal pads 210A and 210B are similar to terminal pads 210 of FIG. 3B.

FIG. 10A is a top view and FIG. 10B is a cross-sectional view through line 10B-10B of FIG. 10A of an integrated circuit chip fabricated with a blocking layer according to an eighth embodiment of the present invention. In FIG. 10B, an integrated circuit chip 50H includes a blocking layer 65H comprising a lower blocking layer 65B1 and an upper wiring level 65B2 on lower blocking layer 65B1. Lower blocking layer 65B1 includes terminal pads 210A and upper blocking layer contains terminal pads 210B. Lower blocking layer 65B1 includes a shield 230A and upper blocking layer 65B2 includes a shield 230B. Each terminal pad 210A is in electrical contact with a corresponding terminal pad 210B and each terminal pad 210A is in electrical contact with a corresponding wire/pad 185. Blocking layers 65B1 and 65B2 are similar to blocking layer 65B of FIG. 4B, terminal pads 210A and 210B are similar to terminal pads 210 of FIG. 4B and shield 230A is similar to shield 230 of FIG. 4B.

FIG. 11A is a top view and FIG. 11B is a cross-sectional view through line 11B-11B of FIG. 11A of an integrated circuit chip fabricated with a blocking layer according to a ninth embodiment of the present invention. In FIG. 11B, an integrated circuit chip 50I includes a blocking layer 65I comprising a lower blocking layer 65C1 and an upper wiring level 65C2 on lower blocking layer 65C1. Lower blocking layer 65C1 includes terminal pads 210A and dummy pads 235A and upper blocking layer 65C2 contains terminal pads 210B and dummy pads 235B. Each terminal pad 210A is in electrical contact with a corresponding terminal pad 210B and each terminal pad 210A is in electrical contact with a corresponding wire/pad 185. Blocking layers 65C1 and 65C2 are similar to blocking layer 65C of FIG. 5B, terminal pads 210A and 210B are similar to terminal pads 210 of FIG. 5B and dummy pads 235A and 235B are similar to dummy pads 235 of FIG. 5B.

FIG. 12A is a top view and FIG. 12B is a cross-sectional view through line 12B-12B of FIG. 12A of an integrated circuit chip fabricated with a blocking layer according to a tenth embodiment of the present invention. In FIG. 12B, an integrated circuit chip 50J includes a blocking layer 65J comprising a lower blocking layer 65D1 and an upper wiring level 65D2 on lower blocking layer 65D1. Lower blocking layer 65D1 includes pads 250A and upper blocking layer 65D2 includes pads 250B. Each terminal pad 250A is in electrical contact with a corresponding terminal pad 250B and each terminal pad 250A is in electrical contact with a corresponding wire/pad 185. Blocking layers 65D1 and 65D2 are similar to blocking layer 65D of FIG. 6B and terminal pads 240A and 240B are similar to terminal pads 240 of FIG. 6B.

FIG. 13A is a top view and FIG. 13B is a cross-sectional view through line 13B-13B of FIG. 13A of an integrated circuit chip fabricated with a blocking layer according to an eleventh embodiment of the present invention. In FIG. 13B, an integrated circuit chip 50K includes a blocking layer 65K comprising a lower blocking layer 65E1 and an upper wiring level 65E2 on lower blocking layer 65E1. Lower blocking layer 65E1 includes terminal pads 240A and upper blocking layer contains terminal pads 240B. Lower blocking layer 65E1 includes a shield 255A and upper blocking layer 65E2 includes a shield 255B. Each terminal pad 240A is in electrical contact with a corresponding terminal pad 240B and each terminal pad 240A is in electrical contact with a corresponding wire/pad 185. Blocking layers 65E1 and 65E2 are similar to blocking layer 65E of FIG. 7B, terminal pads 240A and 240B are similar to terminal pads 240 of FIG. 7B and shields 255A and 255B are similar to shield 255 of FIG. 7B.

Figures 14A, 14B:
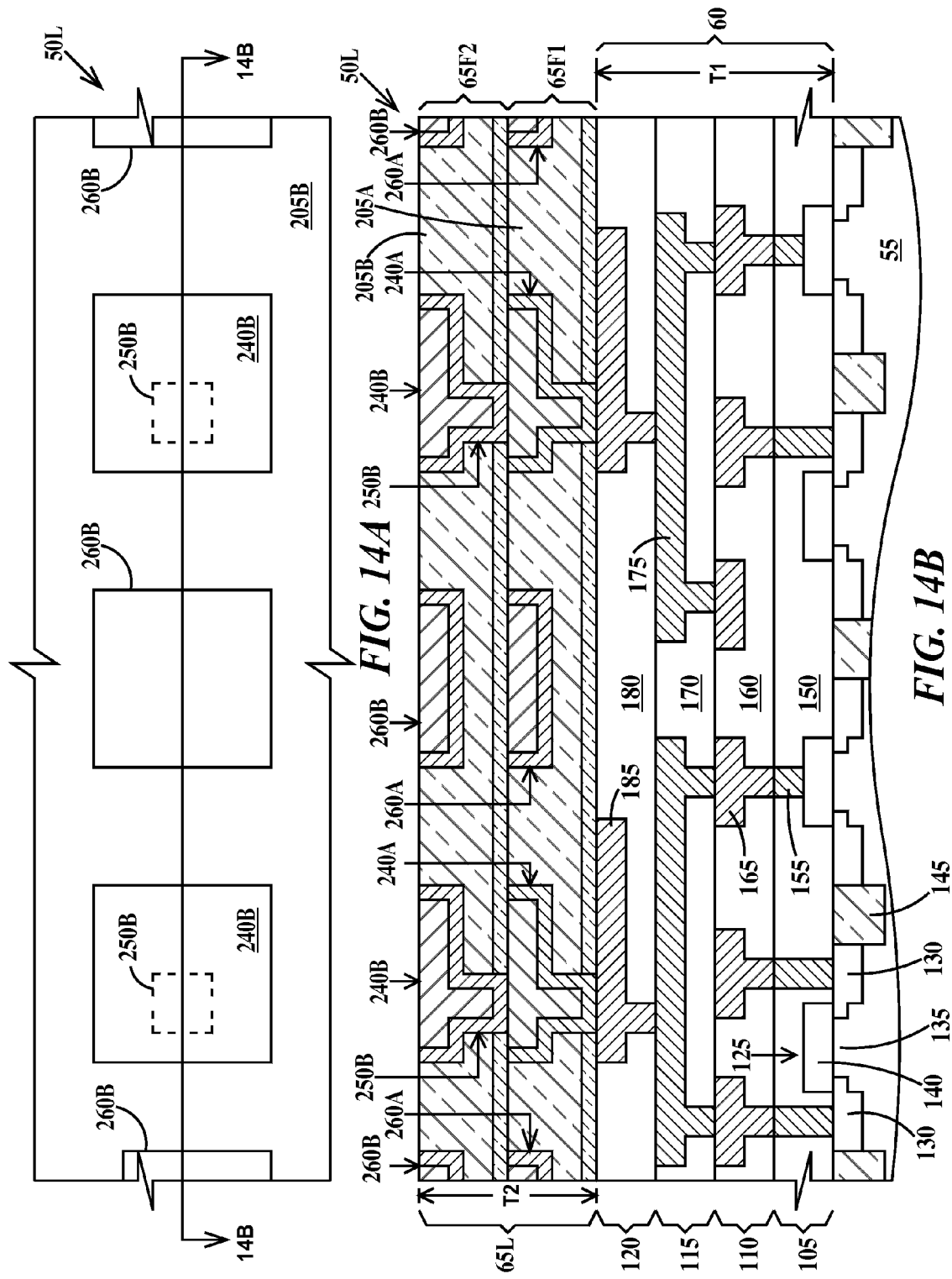
FIG. 14A is a top view and FIG. 14B is a cross-sectional view through line 14B-14B of FIG. 14A of an integrated circuit chip fabricated with an alpha particle blocking layer according to a twelfth embodiment of the present invention.

FIG. 14A is a top view and FIG. 14B is a cross-sectional view through line 14B-14B of FIG. 14A of an integrated circuit chip fabricated with a blocking layer according to a twelfth embodiment of the present invention. In FIG. 14B, an integrated circuit chip 50L includes a blocking layer 65L comprising a lower blocking layer 65F1 and an upper wiring level 65F2 on lower blocking layer 65F1. Lower blocking layer 65F1 includes terminal pads 240A and dummy pads 260A and upper blocking layer contains terminal pads 240B and dummy pads 260B. Each terminal pad 240A is in electrical contact with a corresponding terminal pad 240B and each terminal pad 240A is in electrical contact with a corresponding wire/pad 185. Blocking layers 65F1 and 65F2 are similar to blocking layer 65F of FIG. 8B, terminal pads 240A and 240B are similar to terminal pads 240 of FIG. 8B and dummy pads 260A and 260B are similar to dummy pads 260 of FIG. 8B.

While the seventh, eighth, ninth, tenth, eleventh and twelfth embodiments of the present invention illustrate stacking of two identical blocking layers, the two blocking layers may be different and any combination of the blocking layers of the first, second, third, fourth, fifth and sixth embodiments of the present invention may be used. Likewise, if three or more blocking layers are stacked, each may independently comprise a blocking layer according to the first, second, third, fourth, fifth and sixth embodiments of the present invention. When multiple blocking layers are stacked, they may or may be the same thickness. However, the total thickness of all blocking layers is equal to or greater than T2 (see FIG. 2).

Figure 15A:
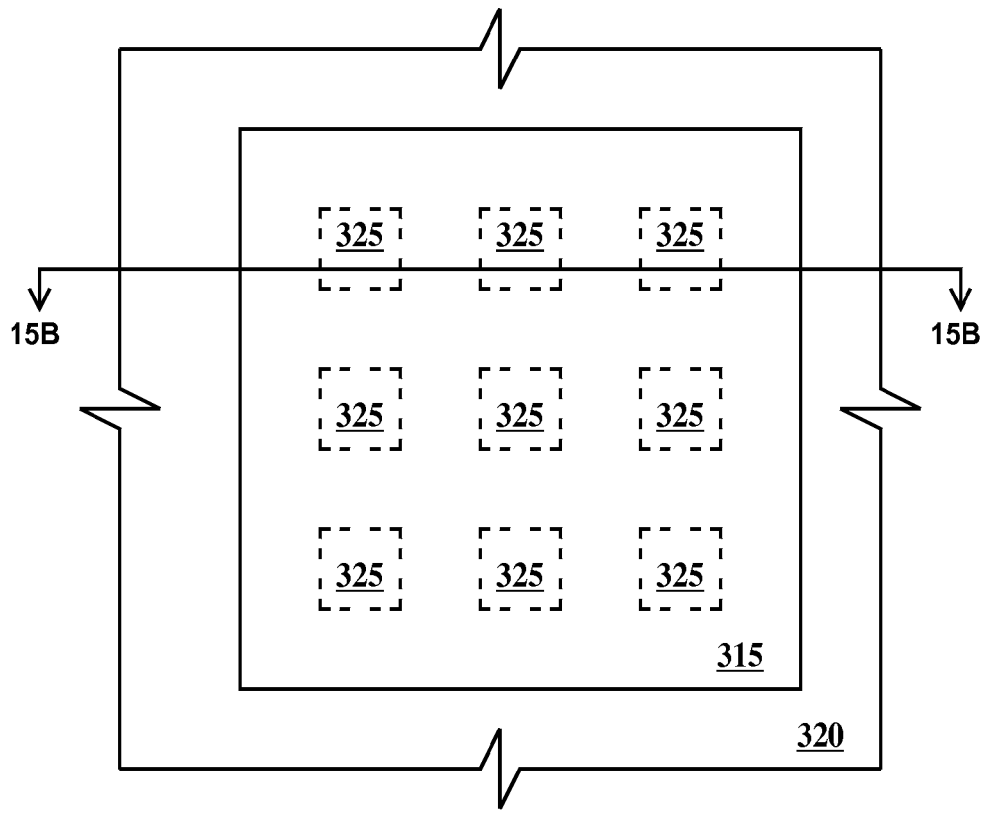
FIG. 15A is a top view and FIG. 15B is a cross-sectional view through line 15B-15B of FIG. 15A of an alternative via structure that may use embodiments of the present invention that utilize dual damascene structures.
Figure 15B:
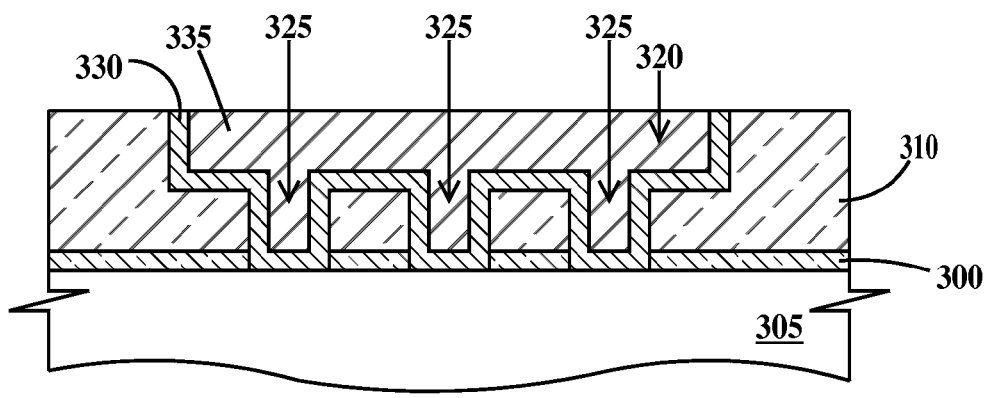

FIG. 15A is a top view and FIG. 15B is a cross-sectional view through line 15B-15B of FIG. 15A of an alternative via structure that may be used in any of the embodiments of the present invention that utilize dual damascene structures. Examples of embodiments of the present invention that utilize dual damascene structure include the seventh, eighth, ninth, tenth, eleventh and twelfth embodiments of the present invention. In FIG. 15B, an optional first dielectric layer 300 is formed on a substrate 305 and formed on first dielectric layer 300 is a second dielectric layer 310. A dual damascene wire 315 includes a wire region 320 and a multiplicity of integrally formed vias 325. Wire 315 comprises an optional conductive liner 330 and a core conductor 335.

Figure 16:
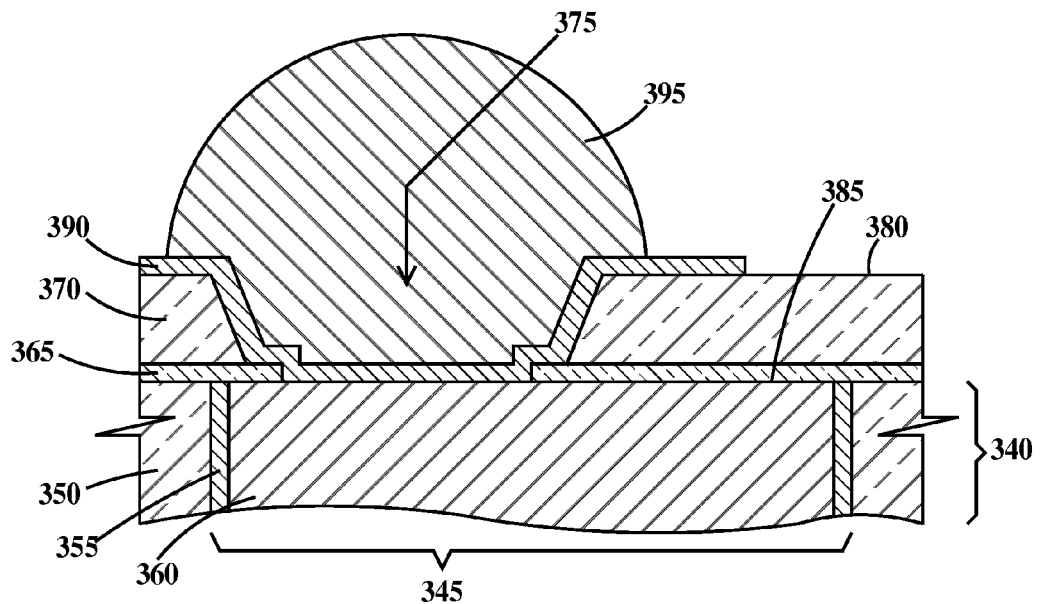
FIG. 16 is a cross-section of a first solder bump structure that may be used with all embodiments of the present invention.

FIG. 16 is a cross-section of a first solder bump structure that may be used with all embodiments of the present invention. In FIG. 16, a blocking layer 340 includes a pad 345 in a dielectric layer 350. Pad 345 includes an optional conductive liner 355 and a core conductor 360. Formed on top of blocking layer 340 is an optional first dielectric layer 365. Formed on top of first dielectric layer 365 is a second dielectric layer 370. A via 375 is formed from a top surface of second dielectric layer 370 to a top surface 385 of pad 345 through first (if present) and second dielectric layers 365 and 370. A ball-limiting-metallurgy (BLM) 390 electrically contacts pad 345 and overlaps via 375. A solder bump 395 electrically contacts BLM 390.

In one example, conductive liner 355 comprises Ta, TaN, Ti, TiN, W, WN, Ru or combinations thereof and core conductor 360 comprises Cu, W, Al or combinations thereof.

In a one example, first dielectric layer 365 comprises $Si_3N_4$, SiC, SiON, SiOC, SiCOH, $PSiN_x$, SiC(N,H) or combinations thereof.

In a first example, dielectric layer 370 comprises $SiO_2$, polyimide, organosilicate glass, diamond-like carbon or combinations thereof. In a second example, second dielectric layer 370 comprises a low K (dielectric constant) material, examples of which include but are not limited to HSQ, MSQ, polyphenylene oligomer, $(SiO_x(CH_3)_y)$, organosilicate glass (SiCOH), porous SiCOH, FSG or combinations thereof. In one example BLM 390 comprises Ni, W, Ti, Cr, Pt, Pd. Sn, Cu or combinations thereof.

In one example, solder bump 395 comprises Pb or a mixture of Pb and Sn.

Figure 17:
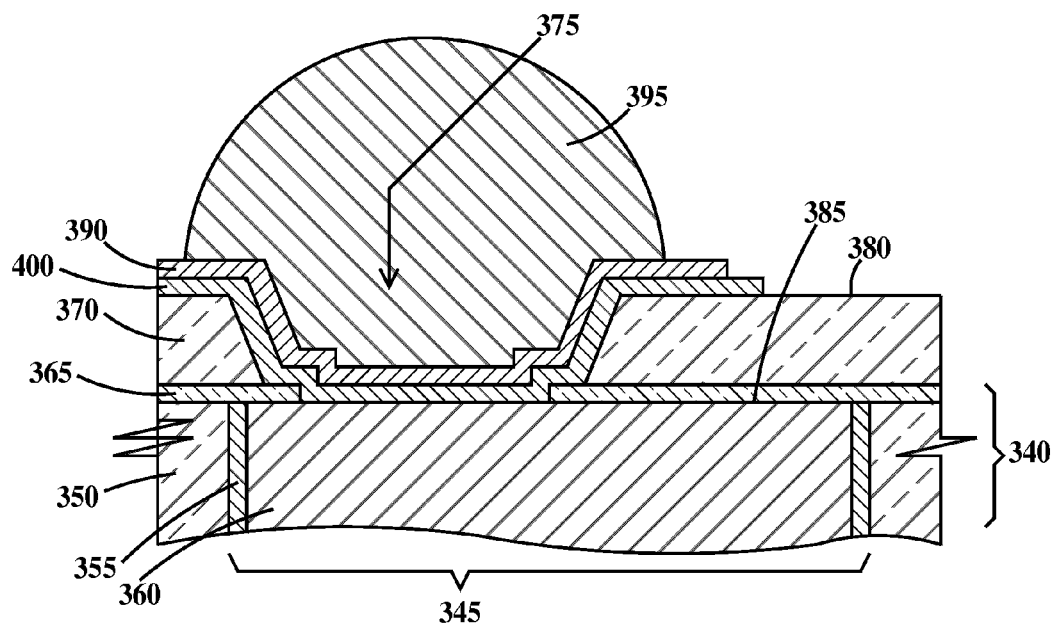
FIG. 17 is a cross-section of a second solder bump structure that may be used with all embodiments of the present invention.

FIG. 17 is a cross-section of a second solder bump structure that may be used with all embodiments of the present invention. FIG. 17 is similar to FIG. 16. The difference being a pad 400 formed in via 375 between BLM 390, first and second dielectric layers 365 and 370 and top surface 385 of pad 345. In one example, pad 400 comprises Al about 0.5 to about 1.0 microns thick.

Figure 18A:
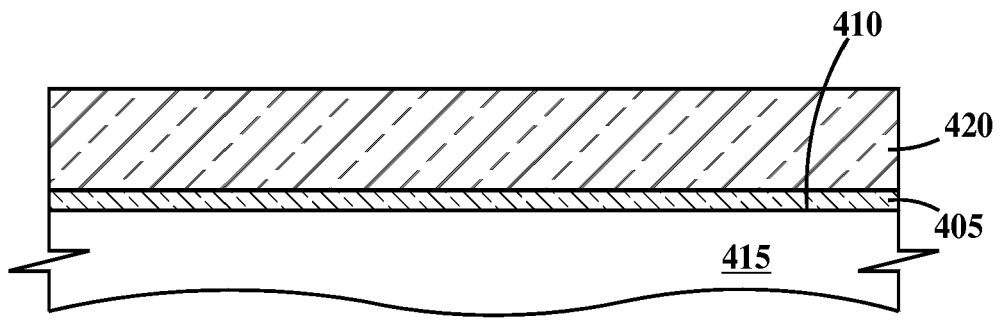
FIGS. 18A through 18F are cross-sections illustrating a method of fabricating alpha particle blocking layers according to the embodiments of the present invention.
Figure 18B:
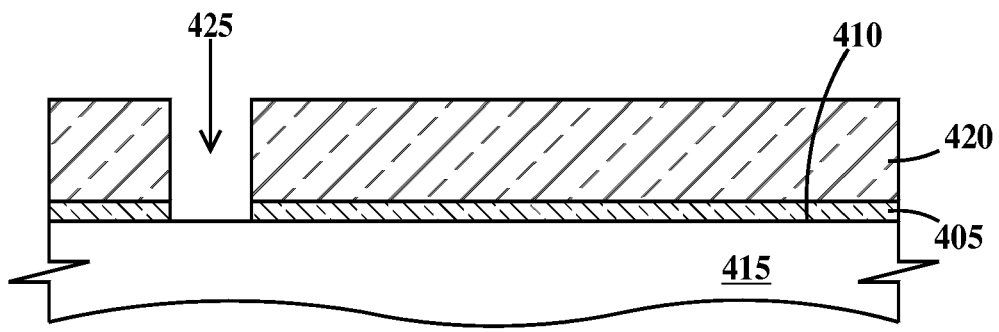
Figure 18C:
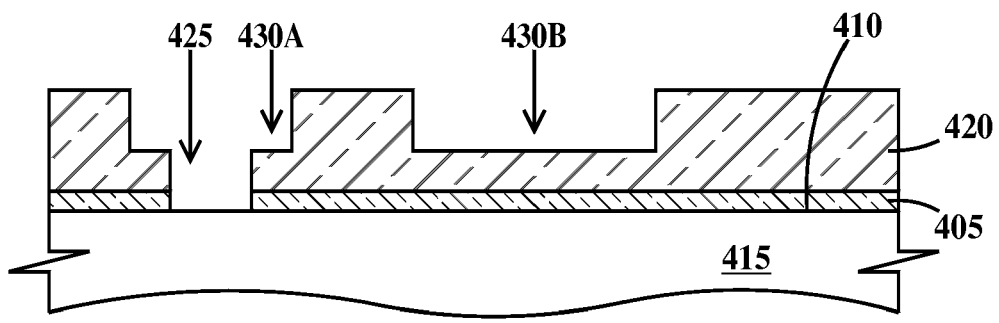
Figure 18D:
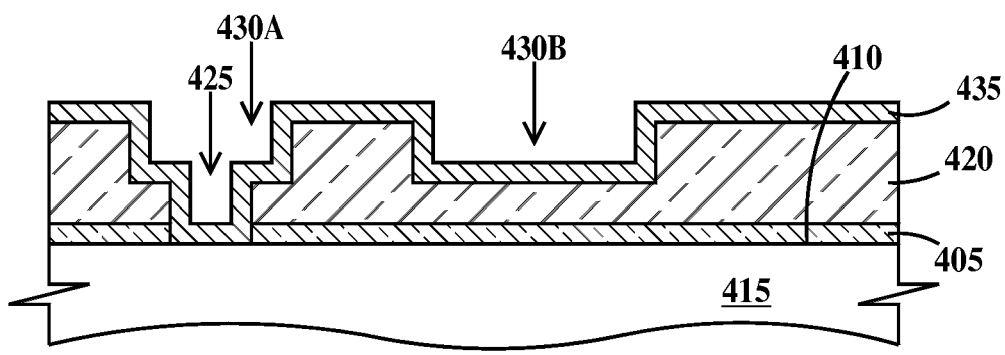

FIGS. 18A through 18F are cross-sections illustrating a method of fabricating blocking layers according to the embodiments of the present invention. A dual damascene process is illustrated in FIGS. 18A through 18F. In FIG. 18A, an optional first dielectric layer 405 is formed on top surface 410 of a substrate 415 and a second dielectric layer 420 is formed on first dielectric layer 405. In FIG. 18B a via opening 425 (or a wire trench in a single damascene process) is formed from a top surface 425 of second dielectric layer 420 through the second dielectric layer and first dielectric layer 405 (if present) to top surface 410 of substrate 415. In FIG. 18C, wire trenches 430A and 430B are formed in second dielectric layer 420. Trenches 430A and 430B do not extend fully through second dielectric layer 420. Trench 430A intersects via opening 425.

Figure 18E:
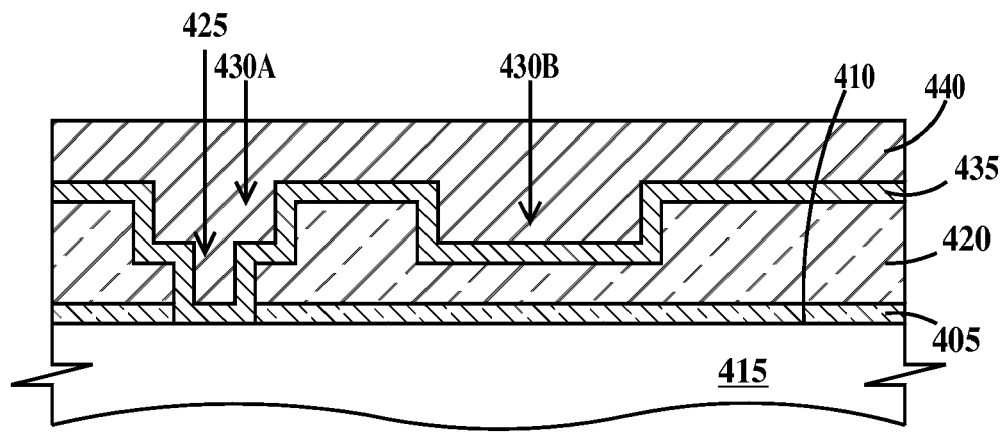
Figure 18F:
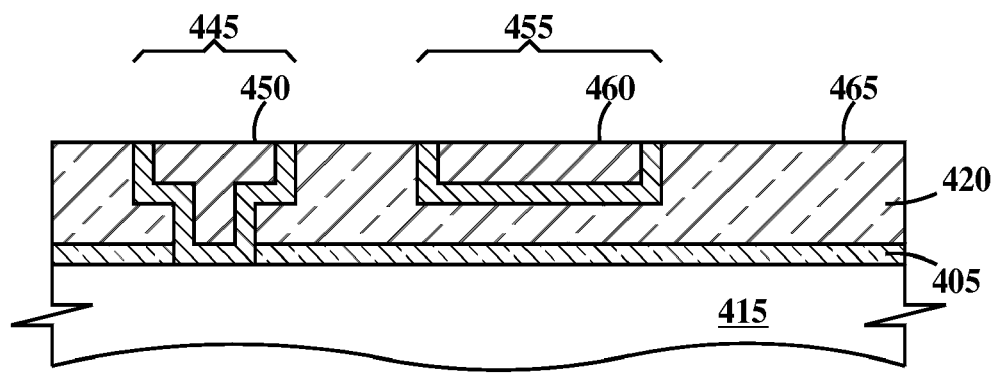

In step 18D, a optional conformal first conductive layer is deposited on all exposed surfaces of first (if present) and second dielectric layers 405 and 420 and those areas of top surface 410 of substrate 415 exposed in the bottom of via opening 425. In FIG. 18E, a second conductive layer 440 is formed on first conductive layer 435 (if present). In one example, second conductive layer 440 is formed by first evaporating or depositing a thin seed layer of metal followed by electroplating a thicker layer of metal on the seed layer. Second conductive layer 440 is thick enough to completely fill vias opening 425 and wire trenches 430A and 430B. This procedure may be used when core conductor comprises Cu. In FIG. 18F, a CMP process has been performed to remove excess first conductive layer 435 (if present) and second conductive layer 440 to form a wire 445 having a top surface 450 and a wire 455 having a top surface 460. Top surface 450 of wire 445 and top surface 460 of wire 455 are coplanar with a top surface 465 of second dielectric layer 420.

In a single damascene process, the steps illustrated in FIG. 18C are not performed. When the steps illustrated in FIG. 18C are performed after the steps illustrated in FIG. 18B, the process is called a via first dual damascene process. When the steps illustrated in FIG. 18C are performed before the steps illustrated in FIG. 18B, the process is called a via second dual damascene process.

FIG. 19 is a diagram illustrating a method for determining the thickness/metal volume percent for blocking layers T2 plus T1 according to the embodiments of the present invention. In FIG. 19, a substrate 500 includes a circuit 505 that may experience a soft error when struck by an alpha particle of a particular energy. In a first example, circuit 505 comprises an electronic memory, examples of which include but are not limited to dynamic random access memory (DRAM), a static random access memory (SRAM), or flash memory. In a second example, circuit 505 comprises a logic circuit. Substrate 500 is mounted to a package 510. In this example, alpha particles from package 510 (if any) do not penetrate through the thickness of substrate 500 and so do not contribute to the detection of soft fails. Circuit 505 is electrically connected to pads 515 by wires 520. Pads 515 of integrated circuit chip 515 are connected to pads 525 on package 510 by wire bonds 530 (or any other suitable means). Solder connections should be avoided unless solder that does not emit alpha particles is used. Pads 525 of package 510 are connected to a tester 535. Tester 535 supplies power and test patterns to electronic memory 505 and monitors the electronic memory for soft error fails.

Also in FIG. 19 is an alpha particle source 540 positioned to deliver a flux of alpha particles of known energy (and optionally of known flux density) to integrated circuit chip 500 and particularly to circuit 505. In a first example, alpha source 540 comprises Th, Americium (Am) or another radioactive material which emits alpha particles. In a second example, alpha source 540 comprises a variable energy alpha particle beam generated with an accelerator. Different combinations of one or more Cu, dielectric, Cu coated dielectric or dielectric coated Cu foils 545 of known thickness are positioned between alpha particle source 540 and substrate 500 to attenuate the alpha particle flux density (and if thick enough to stop the alpha particles from reaching circuit 505). The degree of attenuation may be measured by changes in the soft error fail rate of circuit 505 as measured by tester 535. A value for T2 (see FIG. 2) and Cu volume percent of a blocking layer(s) based on charts similar that of FIG. 1 or simulation models, may then be determined.

Alternatively, when the flux of said alpha particles is contained in a beam smaller then circuit 505, the beam may be scanned across circuit 505 and the combination of said thickness of said blocking layer and said volume percent of metal wire in said blocking layer as a function of a position of said beam relative to a reference coordinate on said test device measured.

Figure 20:
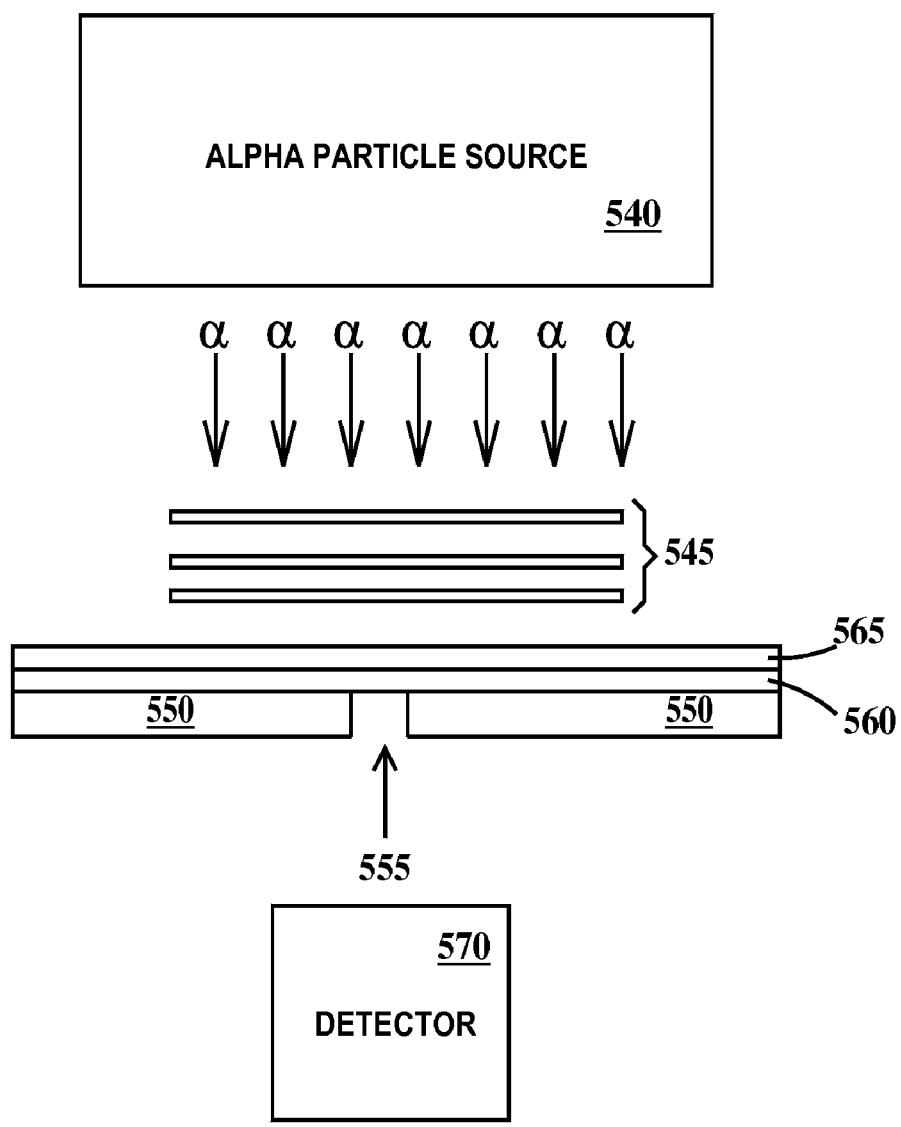
FIG. 20 is a diagram illustrating a alternate method for determining the thickness/metal volume percent for alpha particle blocking layers according to the embodiments of the present invention.

FIG. 20 is a diagram illustrating an alternate method for determining the thickness/metal volume percent for alpha particle blocking layers according to the embodiments of the present invention. FIG. 20 is similar to FIG. 19 except substrate 500 (see FIG. 19) is replaced with a substrate 550, tester 535 (see FIG. 19) is replaced with a alpha particle detector 570 and there is no package 510 (see FIG. 19) or wires 530 (see FIG. 19). Alpha particle source 540, void 555 and detector 570 are aligned over one another. Detector 570 can be a silicon detector, gas proportional counter or other charged-particle detector. A void 555 is formed in substrate 550 exposing a buried oxide layer (BOX) 560 where substrate 550 is a SOI substrate or wiring levels 565 if substrate 550 is, for example, a bulk silicon substrate.

One or more foils 545 are positioned between alpha particle source 540 and void 555 with any alpha particles passing through void 555 (and foils 545) is recorded as either a count rate (alpha/sec) or an energy distribution. A value for T2 (see FIG. 2) and copper volume percent of a blocking layer(s) based on charts similar that of FIG. 1 or simulation models, may then be determined. It is also possible to replace foils 545 with an actual blocking layer. The blocking layer can be built on a silicon substrate independent of the active devices such that the silicon can be etched away leaving the free standing blocking layer of known thickness with a known volume percent Cu. Alpha particle source 540 can be replaced with a monoenergetic alpha-particle beam from a particle accelerator. For a specific embodiment, a micro-beam, of dimensions <1 µm of alpha particles could be used to determine empirically the distribution of the thickness of the blocking layer by scanning the beam over the blocking layer and measuring the transmission and/or the volume fraction of copper of the particles through this layer as a function of the position of the beam/blocking layer.

Alternatively, when the flux of said alpha particles is contained in a beam smaller than void 555. The beam may be scanned across void 555 in order to measure the combination of the thickness of the blocking layer and the volume percent of metal wire in said blocking layer as a function of a position of the beam relative to a reference coordinate on void 555.

As an alternative to the methods illustrated in FIGS. 19 and 20 and described supra, a test integrated circuit chip (memory or logic) having a blocking layer of known thickness and volume percent copper may be mounted on a ceramic substrate using C4's. The circuitry on the integrated circuit chip can then be monitored for soft error upsets induced by alpha particles originating from the solder or ceramic carrier.

A further alternative to the methods illustrated in FIGS. 19 and 20 and described supra, when the flux of said alpha particles is contained in a beam smaller then an integrated circuit chip including a blocking layer, the beam may be scanned across the integrated circuit chip and the combination of said thickness of said blocking layer and said volume percent of metal wire in said blocking layer as a function of a position of said beam relative to a reference coordinate on said integrated circuit chip measured.

Figure 21:
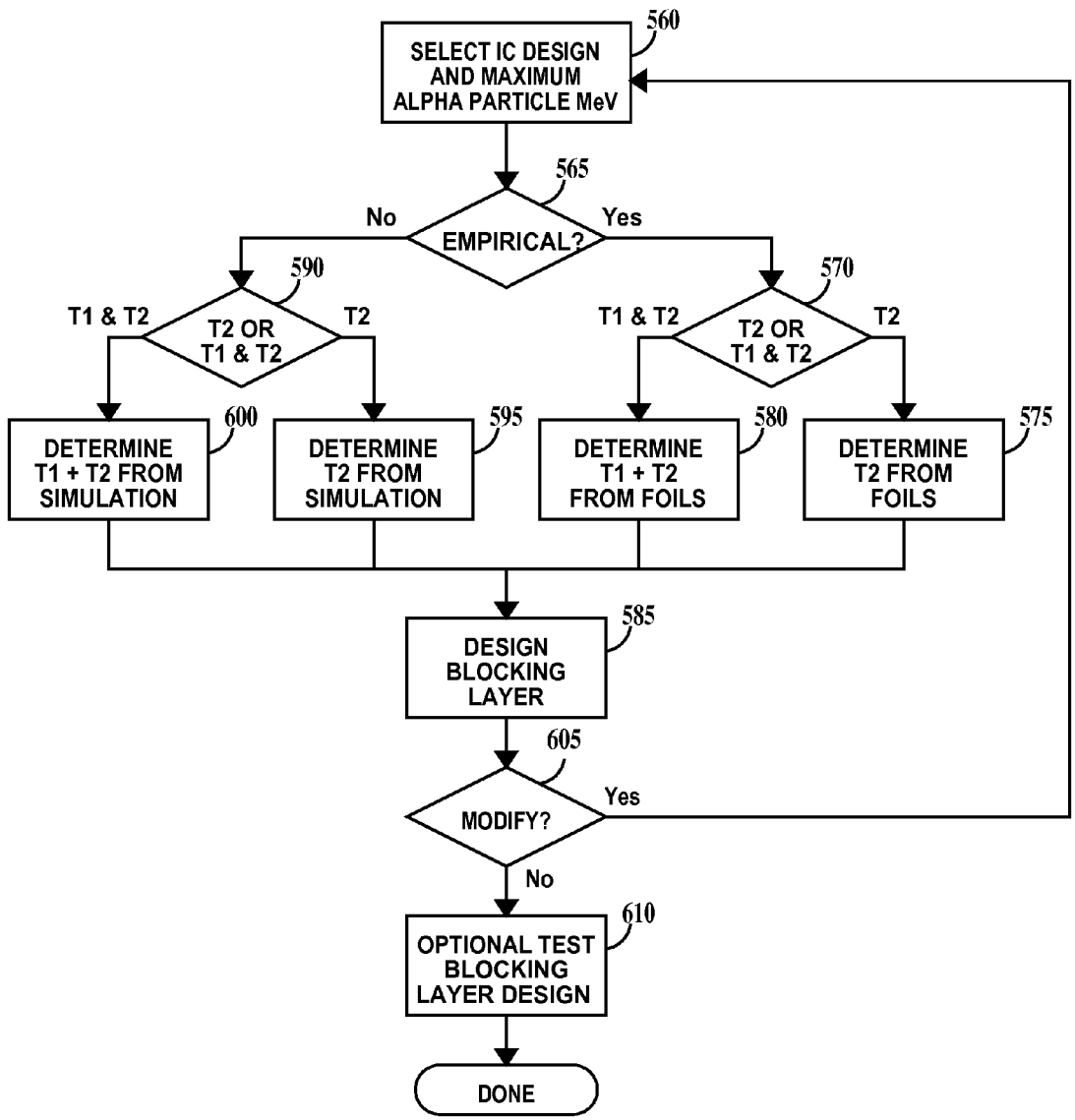
FIG. 21 is a flowchart of the method of designing an alpha blocking layer according to an embodiment of the present invention.

FIG. 21 is a flowchart of the method of designing an alpha blocking layer according to an embodiment of the present invention. In step 560, an integrated circuit design is selected as well as the highest alpha particle energy that is to be stopped a certain distance from the top surface of the blocking layer. In step 565, it is determined if the design of the blocking layer is to be empirically or physically determined. If in step 565 it is decided to empirically determine the design of the blocking layer, the method proceeds to step 570. In step 570 it is determined if only the thickness and metal volume/percent of the blocking layer is to be used to stop alpha particles. If the blocking layer alone is to stop the alpha particles the method proceeds to step 575, otherwise the method proceeds to step 580. In step 575 two methods may be used as described supra in reference to FIG. 19 or FIG. 20. In a first method a test integrated circuit having an electronic memory is prepared with a minimal number of wiring levels (the wires in the wiring levels may be low Z metal) and tested in the apparatus illustrated in FIG. 19 and described supra. In a second method a test integrated circuit having silicon removed from the backside to the BOX (or to the first wiring level) is prepared with a minimal number of wiring levels (the wires in the wiring levels may be low Z metal) and tested in the apparatus illustrated in FIG. 20 and described supra. The method then proceeds to step 585. If in step 570, it was determined that the thickness and metal volume/percent of the blocking layer and normal wiring levels of the integrated circuit are to be used to stop alpha particles then in step 580, a test integrated circuit having an electronic memory is fabricated with the same or similar number wiring levels having the same or similar thickness's and metal volume percent is prepared and tested in the apparatus illustrated in FIG. 19 and described supra. The method then proceeds to step 585.

Returning to step 565, if it is determined to not empirically determine the design of the blocking layer the method proceeds to step 590. In step 590 it is determined if only the thickness and metal volume/percent of the blocking layer is to be used to stop alpha particles. If the blocking layer alone is to stop the alpha particles the method proceeds to step 595, otherwise the method proceeds to step 595. In step 595 a simulation or chart lookup (see FIG. 1) is performed and combined with design ground-rule thickness and metal volume percent for the blocking layers are calculated. The method then proceeds to step 585. If in step 590, it was determined that the thickness and metal volume/percent of the blocking layer and normal wiring levels of the integrated circuit are to be used to stop alpha particles then in step 600, a simulation or chart lookup (see FIG. 1) is performed and combined with design ground-rule thickness and metal volume percent for the blocking layers are calculated taking into account the thickness and metal volume percents of the normal wiring levels. The method then proceeds to step 585.

In step 585, the blocking layer is designed. There are many possible combinations of thickness and metal volume percent that may be used. Wiring level ground-rules, costs, yield and other considerations need to be taken into account in generating a blocking layer design. It may be desirable to add a margin of thickness and/or metal volume percent above that determined capable of stopping the alpha particles. The method then proceeds to step 605. In step 605, it is decided if the design is to be adjusted. If it is decided to reevaluate the design, the method loops back to step 560, otherwise the method proceeds to optional step 610. On a second and any subsequent loops from step 560 through step 585, one or more design parameters, such as thickness of the blocking layer, thickness of wiring levels, volume percent of metal in the blocking or wiring levels, number of blocking or wiring levels, chemical composition of the blocking or wiring levels may be changed. This looping may be performed as many times are required until an acceptable design is obtained.

In optional step 610, the actually blocking layer design may be tested by simulation modeling or actual testing using the apparatus of FIG. 19 or FIG. 20 without foils 545 (see FIG. 19 or FIG. 20).

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multi-chip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Thus the various embodiments of the present invention provide methods and structures for reducing soft error rates in integrated circuits.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A structure, comprising:
   an integrated circuit, comprising:
   a semiconductor substrate; and
   a stack of one or more wiring levels stacked from a lowermost wiring level to an uppermost wiring level, said lowermost wiring level nearer said semiconductor substrate than said uppermost wiring level; and
   an alpha particle blocking layer on a top surface of said uppermost wiring level of said one or more wiring levels, said blocking layer comprising metal wires and a dielectric material, said blocking layer having a combination of a thickness of said blocking layer and a volume percent of metal wires in said blocking layer sufficient to stop a predetermined percentage of alpha particles of a selected energy or less striking said blocking layer from penetrating into said stack of one or more wiring levels.

2. The structure of claim 1, wherein said blocking layer includes terminal pads, each terminal pad connected to a corresponding wire in said uppermost wiring level.

3. The structure of claim 2, said blocking layer further including dummy terminal pads, said dummy terminal pads interspersed with said terminal pads and not connected to each other or to any of said terminal pads or to any wires in said uppermost wiring level.

4. The structure of claim 2, said blocking layer further including a metal shield having openings, said terminal pads positioned within said openings and said terminal not electrically contacting said shield.

5. The structure of claim 1, wherein said predetermined percentage of alpha particles is about 99% or greater of said alpha particles of said selected energy and wherein said selected energy is equal to or less than about 10 MeV.

6. The structure of claim 1, wherein said metal wires comprise a structure selected from the group consisting of a damascene wire, a damascene via, a damascene terminal pad, a dual damascene wire having one or more integral vias, a dual damascene terminal pad having one or more integral vias and combinations thereof.

7. The structure of claim 1, wherein the metal wires comprise material selected from the group consisting of Ta, TaN, Ti, TiN, W, WN, Ru, Cu and combinations thereof and the dielectric material is selected from the group consisting of silicon dioxide, fluorinated silicon dioxide, polyimide, a low K material having a permittivity of 4 or less, hydrogen silsesquioxane polymer, methyl silsesquioxane polymer, polyphenylene oligomer, $SiO_x(CH_3)_y$, organosilicate glass, SiCOH, porous SiCOH, diamond-like carbon and combinations thereof.

8. The structure of claim 1, wherein said combination of said thickness of said blocking layer and said volume percent of metal wires in said blocking layer is sufficient to stop said predetermined percentage of alpha particles of said selected energy or less striking said blocking layer from penetrating into said lower most wiring level.

9. The structure of claim 1, wherein said combination of said thickness of said blocking layer and said volume percent of metal wires in said blocking layer is sufficient to stop said predetermined percentage of alpha particles of said selected energy or less striking said blocking layer from penetrating into said substrate.

10. The structure of claim 1, wherein said combination of said thickness of said blocking layer and said volume percent of metal wires in said blocking layer is sufficient to stop said predetermined percentage of alpha particles of said selected energy or less striking said blocking layer from penetrating into a structure comprising a semiconductor material formed in said integrated circuit chip.

11. A structure, comprising:
    an integrated circuit, said integrated circuit comprising:
    a semiconductor substrate; and
    a stack of one or more wiring levels on a top surface of said substrate, said stack of one or more wiring levels stacked from a lowermost wiring level to an uppermost wiring level, said lowermost wiring level nearer said semiconductor substrate than said uppermost wiring level; and
    an alpha particle blocking layer on a top surface of said uppermost wiring level of said one or more wiring levels, said blocking layer comprising metal wires and a dielectric material, a combination of the thickness of said stack of wiring levels and a volume percent of metal wires in said stack of wiring levels, and a thickness of said blocking layer and a volume percent of metal wires in said blocking layer sufficient to stop a predetermined percentage of alpha particles of a selected energy or less striking said blocking layer from penetrating into said substrate.

12. The structure of claim 11, wherein said blocking layer includes terminal pads, each terminal pad connected to a corresponding wire in said uppermost wiring level.

13. The structure of claim 11, wherein said predetermined percentage of alpha particles is about 99% or greater of said alpha particles of said selected energy and wherein said selected energy is equal to or less than about 10 MeV.

14. The structure of claim 11, wherein said metal wires comprise a structure selected from the group consisting of a damascene wire, a damascene via, a damascene terminal pad, a dual damascene wire having one or more integral vias, a dual damascene terminal pad having one or more integral vias and combinations thereof.

15. The structure of claim 11, wherein the metal wires comprise material selected from the group consisting of Ta, TaN, Ti, TiN, W, WN, Ru, Cu and combinations thereof and the dielectric material is selected from the group consisting of silicon dioxide, fluorinated silicon dioxide, polyimide, a low K material having a permittivity of 4 or less, hydrogen silsesquioxane polymer, methyl silsesquioxane polymer, polyphenylene oligomer, $SiO_x(CH_3)_y$, organosilicate glass, SiCOH, porous SiCOH, diamond-like carbon and combinations thereof.

* * * * *